US 12,457,726 B2

(12) United States Patent
Ohori et al.

(10) Patent No.: US 12,457,726 B2
(45) Date of Patent: Oct. 28, 2025

(54) WORK SYSTEM AND FEEDER CARRIAGE TRANSFER METHOD

(71) Applicant: Panasonic Intellectual Property Management Co., Ltd., Kadoma (JP)

(72) Inventors: Tetsushi Ohori, Tokyo (JP); Takashi Uchino, Fukuoka (JP); Hiroki Yamamoto, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/591,145

(22) Filed: Feb. 29, 2024

(65) Prior Publication Data
US 2024/0206142 A1 Jun. 20, 2024

Related U.S. Application Data

(63) Continuation of application No. 17/009,165, filed on Sep. 1, 2020, now Pat. No. 11,950,369, which is a
(Continued)

(30) Foreign Application Priority Data

Jun. 29, 2018 (JP) .................................. 2018-124067

(51) Int. Cl.
*H05K 13/00* (2006.01)
*B66F 9/06* (2006.01)
*G05B 19/418* (2006.01)

(52) U.S. Cl.
CPC ......... *H05K 13/0084* (2013.01); *B66F 9/063* (2013.01); *G05B 19/41865* (2013.01); *H05K 13/0015* (2013.01); *G05B 2219/50393* (2013.01)

(58) Field of Classification Search
CPC ............ H05K 13/0084; H05K 13/0015; B66F 9/063; G05B 19/41865; G05B 2219/50393
See application file for complete search history.

(56) References Cited

U.S. PATENT DOCUMENTS 4,984,354 A * 1/1991 Mohara .............. H05K 13/0413
29/740
5,224,325 A * 7/1993 Takahashi ............ H05K 13/085
53/445
(Continued)

FOREIGN PATENT DOCUMENTS

CN 106538088 B 5/2019
CN 109775211 A * 5/2019
(Continued)

OTHER PUBLICATIONS

Translation of JP-201904859) (Year: 2019).*
(Continued)

*Primary Examiner* — Jeffrey T Carley
(74) *Attorney, Agent, or Firm* — MCDONALD HOPKINS LLC

(57) ABSTRACT

A work system includes a mounting system which mounts a component on a board and an unmanned conveyance system having an unmanned conveyance vehicle. The unmanned conveyance system includes a first notifier which notifies the mounting system of an arrival notification indicating that the unmanned conveyance vehicle transfers the feeder carriage to a position where an operation of connecting the feeder carriage to the base starts, and a first processor which causes the unmanned conveyance vehicle to travel in a direction away from the base upon receiving, from the mounting system, a connection completion indicating that a connection of the feeder carriage is completed. The mounting system includes a second processor which causes the connection mechanism to connect the feeder carriage upon
(Continued)

receiving the arrival notification, and a second notifier which notifies the unmanned conveyance system of the connection completion upon being informed of completion of the connection.

5 Claims, 29 Drawing Sheets

Related U.S. Application Data continuation of application No. PCT/JP2019/004145, filed on Feb. 6, 2019.

(56) References Cited

U.S. PATENT DOCUMENTS

| | | | |
|---|---|---|---|
| 6,000,523 A * | 12/1999 | Asai | H05K 13/0409 198/377.08 |
| 6,273,666 B1 * | 8/2001 | Barnowski | H05K 13/0417 29/832 |
| 6,606,785 B1 | 8/2003 | Kadohata et al. | |
| 6,860,002 B2 | 3/2005 | Oyama | |
| 9,963,303 B2 * | 5/2018 | Mizuno | B65G 47/90 |
| 10,004,168 B2 * | 6/2018 | Mizuno | H05K 13/0417 |
| 10,299,420 B2 * | 5/2019 | Kawase | H05K 13/085 |
| 10,356,970 B2 | 7/2019 | Takanami et al. | |
| 10,362,719 B2 | 7/2019 | Iisaka et al. | |
| 10,874,041 B2 * | 12/2020 | Matsuyama | H05K 13/0885 |
| 10,960,999 B2 | 3/2021 | Eguchi et al. | |
| 11,134,601 B2 * | 9/2021 | Ushii | H05K 13/0409 |
| 11,357,151 B2 * | 6/2022 | Ito | H05K 13/0417 |
| 2009/0065149 A1 * | 3/2009 | Yamasaki | H05K 13/0417 156/353 |
| 2009/0074550 A1 | 3/2009 | Yamasaki | |
| 2017/0354070 A1 * | 12/2017 | Kobayashi | H05K 13/086 |
| 2019/0095834 A1 * | 3/2019 | Nakazono | G06Q 10/06312 |
| 2019/0098807 A1 | 3/2019 | Kobayashi et al. | |
| 2020/0396874 A1 | 12/2020 | Ohori et al. | |

FOREIGN PATENT DOCUMENTS

| | | | | |
|---|---|---|---|---|
| EP | 0919323 A1 | 6/1999 | | |
| EP | 2874480 A1 * | 5/2015 | | H05K 13/084 |
| JP | 2003188591 A * | 7/2003 | | |
| JP | 2005-347351 A | 12/2005 | | |
| JP | 2006-093536 A | 4/2006 | | |
| JP | 2009-071029 A | 4/2009 | | |
| JP | 2012-134331 A | 7/2012 | | |
| JP | 2017-135195 A | 8/2017 | | |
| JP | 2019204859 A * | 11/2019 | | |
| JP | 2020-003581 A1 | 7/2020 | | |
| WO | WO-2017033268 A1 * | 3/2017 | | H05K 13/021 |
| WO | 2017/130345 A1 | 8/2017 | | |

OTHER PUBLICATIONS

Translation of CN-109775211-A (Year: 2019).*
Translation of JP-2003188591-A (Year: 2003).*
International Search Report of PCT application No. PCT/JP2019/004145 dated Apr. 23, 2019.
English Translation of Chinese Search Report dated Nov. 6, 2023 for the related Chinese Patent Application No. 202111638388.4.

* cited by examiner

WORK SYSTEM AND FEEDER CARRIAGE TRANSFER METHOD

CROSS-REFERENCE TO RELATED APPLICATIONS

This is a continuation of U.S. patent application Ser. No. 17/009,165 filed on Sep. 1, 2020, which is a continuation of the PCT International Application No. PCT/JP2019/004145 filed on Feb. 6, 2019, which claims the benefit of foreign priority of Japanese patent application No. 2018-124067 filed on Jun. 29, 2018, the contents all of which are incorporated herein by reference.

BACKGROUND

1. Technical Field

The present disclosure relates to a work system (an operation system) including a mounting system having a component-mounting device in which a mounting head mounts a component supplied by a part feeder on a board and an unmanned conveyance system, and a feeder carriage transfer method.

2. Description of the Related Art

In a component-mounting device, after a mounting head sucks a component supplied by a part feeder connected to a base using a nozzle, the component is mounted on a board positioned by a board positioner, and thus, a mount board is produced. The part feeder is attached to a feeder carriage which can be freely connected to and separated from the base, and is connected to the base by connecting the feeder carriage to the base. In the component-mounting device, according to a change of a board model or the like, it is necessary to replace a feeder carriage on which a part feeder for production of a board after the model change is set (for example, refer to Japanese Patent Unexamined Publications No. 2006-093536 and No. 2009-71029). In recent years, for the purpose of automation and labor saving, it has been proposed to replace the feeder carriage by an unmanned conveyance vehicle.

SUMMARY

According to an aspect of the present disclosure, there is provided a work system including a mounting system which mounts a component on a board and an unmanned conveyance system which has an unmanned conveyance vehicle. The mounting system includes a base which has a board positioner for positioning the board, a feeder carriage which is attachable to and detachable from the base, a connection mechanism which connects the feeder carriage to the base, a part feeder which is attached to the feeder carriage and supplies the component in a state where the feeder carriage is connected to the base, and a mounting head which mounts the component supplied by the part feeder on the board positioned by the board positioner. The unmanned conveyance system includes a first notifier which notifies the mounting system of an arrival notification indicating that the unmanned conveyance vehicle arrives at a position where a separation operation of separating the feeder carriage connected to the base from the base starts, and a first processor which causes the unmanned conveyance vehicle to travel in a direction away from the base when first processor receives, from the mounting system, a release notification indicating that a connection of the feeder carriage is released. The mounting system further includes a second processor which causes the connection mechanism to perform a release operation of releasing the connection of the feeder carriage when the second processor receives the arrival notification, and a second notifier which notifies the unmanned conveyance system of the release notification upon being informed of completion of the release operation.

According to another aspect of the present disclosure, there is provided a work system including a mounting system which mounts a component on a board and an unmanned conveyance system which has an unmanned conveyance vehicle. The mounting system includes a base which has a board positioner for positioning the board, a feeder carriage which is attachable to and detachable from the base, a connection mechanism which connects the feeder carriage to the base, a carriage detection sensor configured to detect whether or not the feeder carriage is located at a position where the feeder carriage is connectable by the connection mechanism, a part feeder which is attached to the feeder carriage and supplies the component in a state where the feeder carriage is connected to the base, and a mounting head which mounts the component supplied by the part feeder on the board positioned by the board positioner. The unmanned conveyance system includes a first notifier which notifies the mounting system of an arrival notification indicating that the unmanned conveyance vehicle transfers the feeder carriage scheduled to be connected to the base to a position where an operation of connecting the feeder carriage to the base starts, and a first processor which causes the unmanned conveyance vehicle to travel so as to move the feeder carriage to the position where the feeder carriage is connectable by the connection mechanism when the first processor receives, from the mounting system, a connection permission of permitting a connection of the feeder carriage to the base, and causes the unmanned conveyance vehicle to travel in a direction away from the base when the first processor receives, from the mounting system, a connection completion indicating that the connection of the feeder carriage is completed. The mounting system further includes a second processor which notifies the unmanned conveyance system of the connection permission when the second processor receives the arrival notification, and after the notification, operates the connection mechanism to connect the feeder carriage to the base when the carriage detection sensor detects the feeder carriage, and a second notifier which notifies the unmanned conveyance system of the connection completion upon being informed of completion of the connection.

According to still another aspect of the present disclosure, there is provided a feeder carriage transfer method of transferring a feeder carriage using an unmanned conveyance vehicle, in a mounting system including a base which has a board positioner for positioning a board, the feeder carriage which is attachable to and detachable from the base, connection mechanism which connects the feeder carriage to the base, a part feeder which is attached to the feeder carriage and supplies the component in a state where the feeder carriage is connected to the base, and a mounting head which mounts the component supplied by the part feeder on the board positioned by the board positioner. The feeder carriage transfer method includes moving the unmanned conveyance vehicle to a position where a separation operation of separating the feeder carriage connected to the base from the base starts; notifying, from an unmanned conveyance system for controlling the unmanned conveyance vehicle, the mounting system of an arrival notification indicating that the unmanned conveyance vehicle arrives at a position where the separation operation starts; releasing connection of the feeder carriage by the connection mechanism when the mounting system receives the arrival notification; notifying, from the mounting system, the unmanned conveyance system of a release notification indicating that the connection of the feeder carriage is released; and moving the feeder carriage in a direction away from the base by the unmanned conveyance vehicle when the unmanned conveyance system receives the release notification.

According to still another aspect of the present disclosure, there is provided a feeder carriage transfer method of transferring a feeder carriage using an unmanned conveyance vehicle, in a mounting system including a base which has a board positioner for positioning a board, the feeder carriage which is attachable to and detachable from the base, connection mechanism which connects the feeder carriage to the base, a part feeder which is attached to the feeder carriage and supplies the component in a state where the feeder carriage is connected to the base, and a mounting head which mounts the component supplied by the part feeder on the board positioned by the board positioner. The feeder carriage transfer method includes moving the feeder carriage scheduled to be connected to the base to a position where the feeder carriage is connectable by the connection mechanism, using the unmanned conveyance vehicle; detecting, in the mounting system, whether or not the feeder carriage is located at the position where the feeder carriage is connectable by the connection mechanism, using a carriage detection sensor; operating, in the mounting system, the connection mechanism to connect the feeder carriage to the base when the feeder carriage is detected; causing the unmanned conveyance vehicle to travel in a direction away from the feeder carriage connected to the base upon being informed of completion of the connection.

According to the present disclosure, it is possible to provide the work system and the feeder carriage transfer method capable of replacing the feeder carriage by linking the mounting system and the unmanned conveyance system.

DETAILED DESCRIPTION OF PREFERRED EMBODIMENTS

It is hard to say that a method of linking a mounting system and an unmanned conveyance system for replacing a feeder carriage has been fully established. Therefore, an object of the present disclosure is to provide a work system and a feeder carriage transfer method which link the mounting system and the unmanned conveyance system to replace the feeder carriage.

Figure 1:
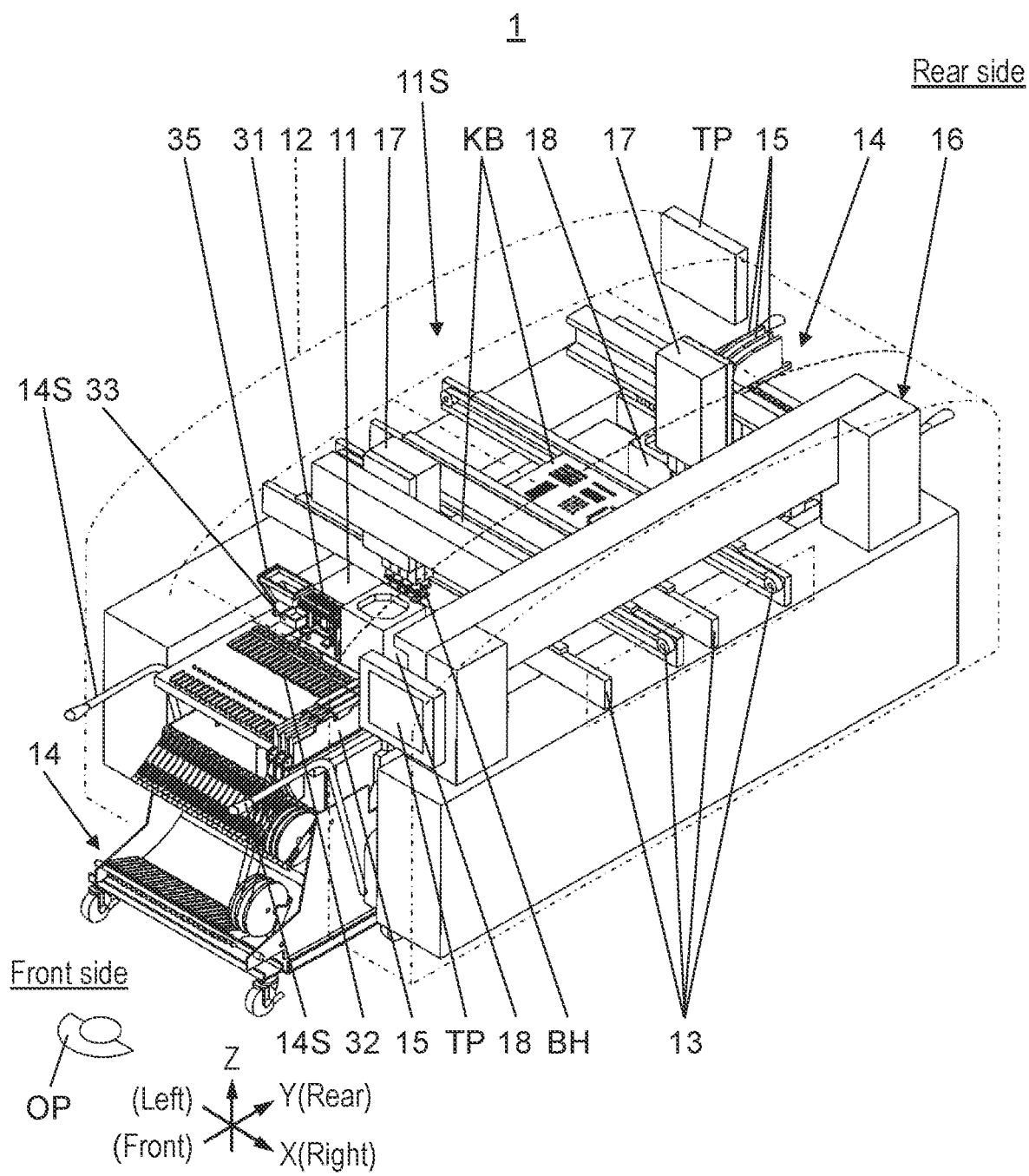
FIG. 1 is a perspective view of a component-mounting device according to an embodiment of the present disclosure.
Figure 2:
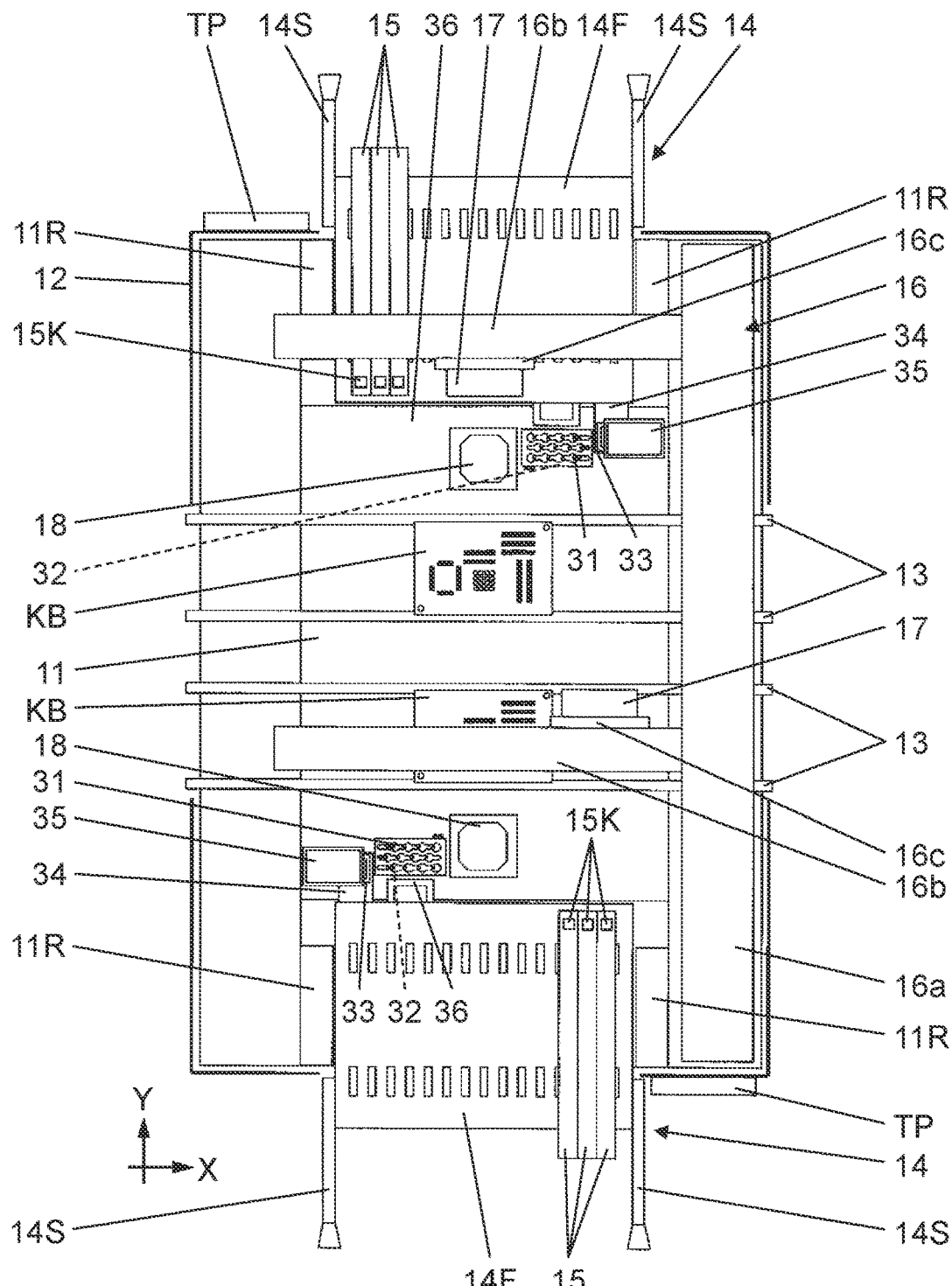
FIG. 2 is a plan view of the component-mounting device according to the embodiment of the present disclosure.
Figure 3:
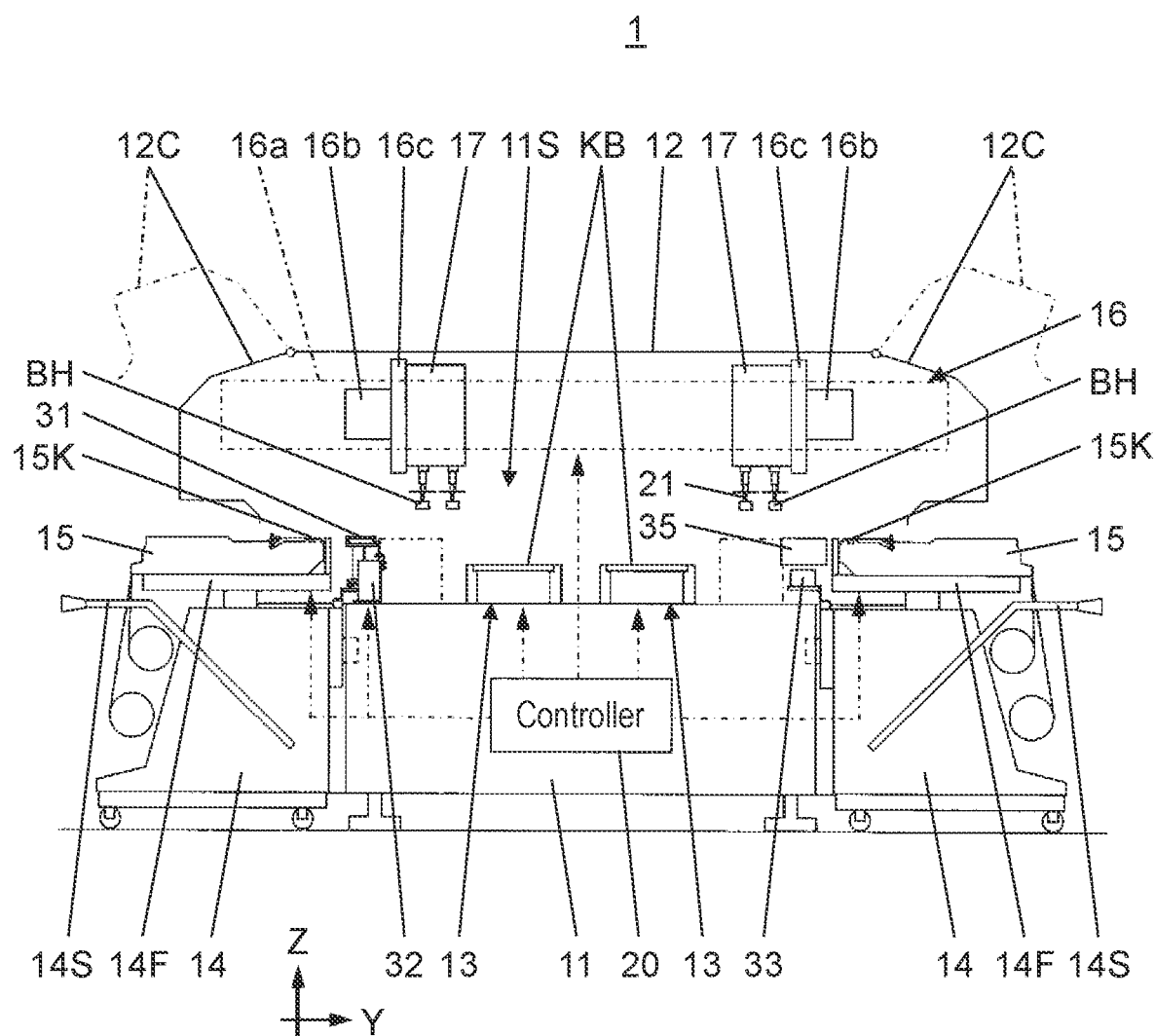
FIG. 3 is a side view of the component-mounting device according to the embodiment of the present disclosure.

Embodiments of the present disclosure will be described with reference to the drawings. FIGS. 1, 2, and 3 illustrate component-mounting device 1 according to an embodiment of the present disclosure. Component-mounting device 1 is an apparatus which mounts component BH on board KB carried in from an outside to produce a component mount board, and includes base 11, base cover 12, two transfer conveyors 13, two feeder carriages 14, part feeder 15, head movement mechanism 16, two mounting heads 17, two component cameras 18, or the like. In the present embodiment, for convenience of description, a left-right direction of component-mounting device 1 is an X-axis direction, a front-rear direction thereof is a Y-axis direction, and an up-down direction thereof is a Z-axis direction. Further, one side in the front-rear direction of component-mounting device 1 is a front side and the other side is a rear side.

In FIGS. 1, 2 and 3, two transfer conveyors 13 include front-side transfer conveyor 13 and rear-side transfer conveyor 13. Each of two transfer conveyors 13 extends in the X-axis direction. Each of two transfer conveyors 13 functions as a board positioner, and transfers board KB carried in from the outside in the X-axis direction and positions board KB at a predetermined working position.

Base cover 12 is provided so as to cover base 11, and working space 11S is formed between base cover 12 and an upper surface of base 11 (FIGS. 1 and 3). Door 12C constituting a portion of base cover 12 is provided on each of a front side and a rear side of base cover 12 (FIG. 3). Door 12C is opened and closed freely in the up-down direction, and operator OP can manually open and close door 12C. In FIG. 3, door 12C in the state of being opened upward is illustrated by dash-dotted lines.

In FIGS. 1, 2, and 3, feeder carriage 14 is connected to each of a front side and a rear side of base 11 so as to be attachable to and detachable from each of the front side and the rear side. A region on base 11 in front of front-side transfer conveyor 13 is a front-side equipment installation region, and front-side feeder carriage 14 is connected to be adjacent to the front of the front-side equipment installation region. A region on base 11 behind rear-side transfer conveyor 13 is a rear-side equipment installation region, and rear-side feeder carriage 14 is connected to be adjacent to the rear of the rear-side equipment installation region.

Figure 4:
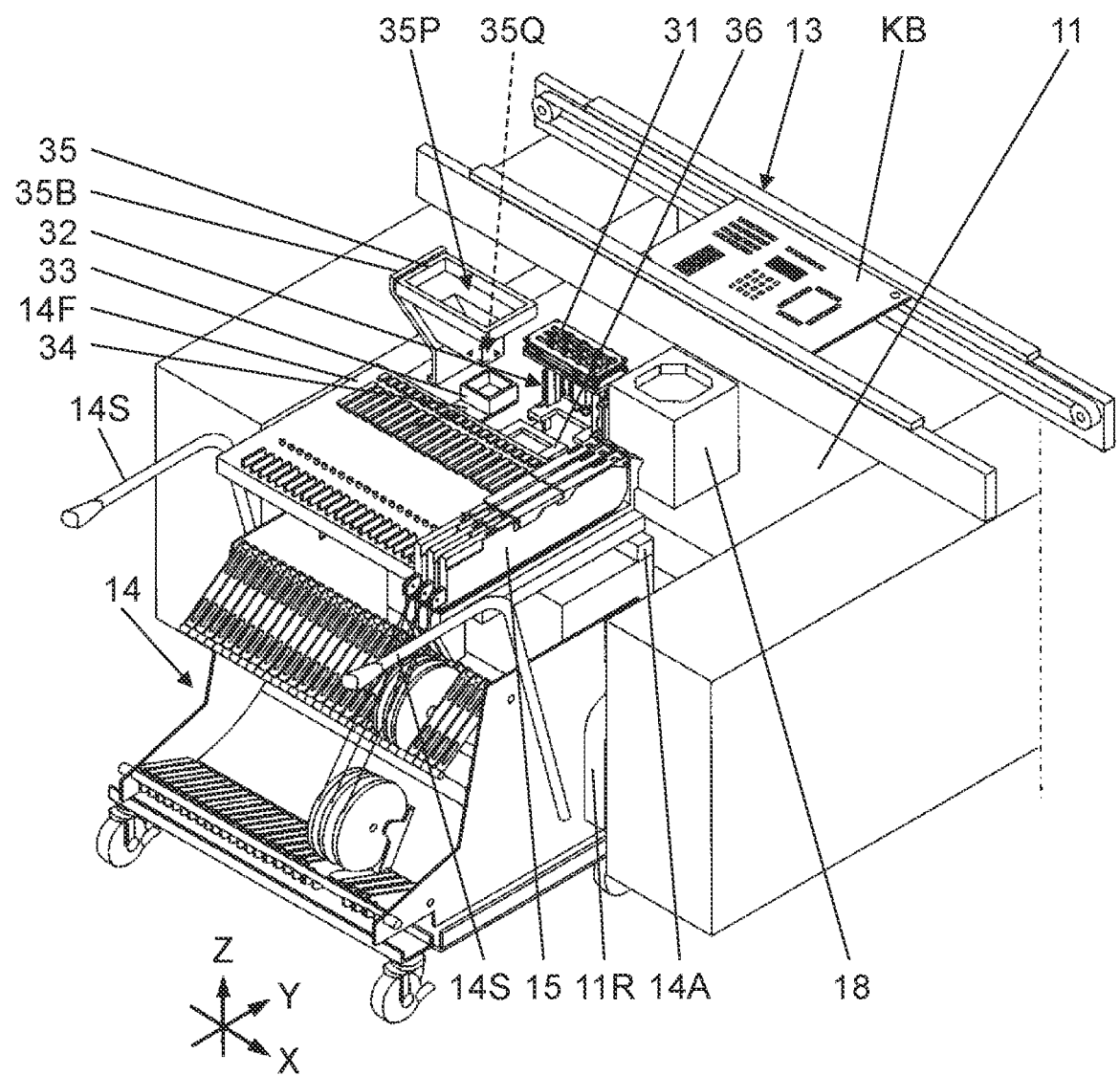
FIG. 4 is a perspective view of a portion of the component-mounting device according to the embodiment of the present disclosure.

In FIGS. 1, 2, and 3, each feeder carriage 14 includes flat feeder base 14F. Part feeder 15 is attached to an upper surface side of feeder base 14F. Plurality of part feeders 15 can be attached to feeder base 14F to be arranged in the X-axis direction (FIGS. 2 and 4). In each of front-side feeder carriage 14 and rear-side feeder carriage 14, a side facing a center portion of base 11 in a state where feeder carriage 14 is connected to base 11 is referred to as a "base side" of feeder carriage 14.

Part feeder 15 is detachably attached to feeder base 14F of feeder carriage 14 and supplies component BH to component supply port 15K. In a state where part feeder 15 is attached to feeder base 14F, component supply port 15K is positioned above a base-side end portion of feeder base 14F (FIGS. 2 and 3). Here, part feeder 15 is assumed to be a tape feeder of a type in which a carrier tape enclosing component BH is pitch-fed to supply component BH to component supply port 15K. However, part feeder 15 is not limited to the tape feeder and may be a bulk feeder, a stick feeder or the like.

In FIG. 2 and FIG. 4, two operation units 14S which are operated by both hands of operator OP are provided on the right and left of each feeder carriage 14. Operator OP operates operation unit 14S so that the base-side end portion of feeder base 14F approaches toward a center portion of base 11 and feeder carriage 14 is connected to base 11. When feeder carriage 14 is connected to base 11, plurality of part feeders 15 attached to feeder base 14F are collectively connected to base 11.

When part feeder 15 is connected to base 11 by connecting feeder carriage 14 to base 11, component supply port 15K of part feeder 15 is located in working space 11S (FIG. 3). Therefore, when part feeder 15 connected to base 11 feeds component BH to component supply port 15K, component BH is supplied into working space 11S.

Figure 5:
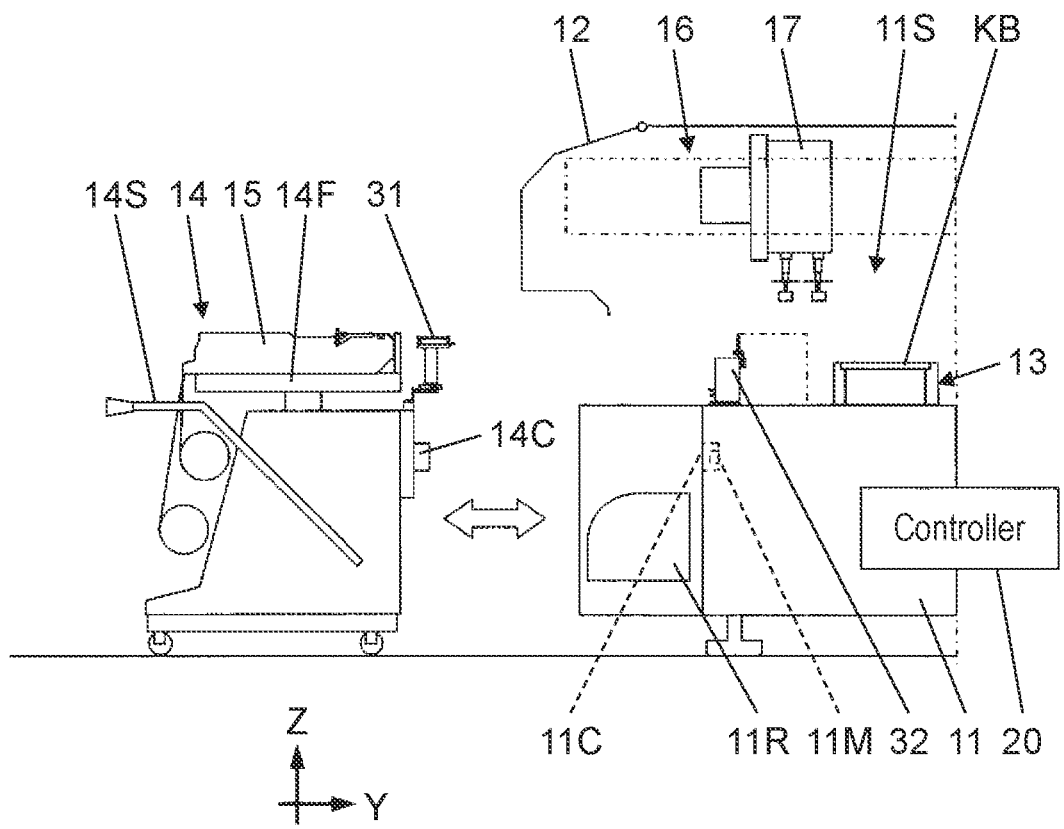
FIG. 5 is a side view illustrating a state in which a feeder carriage is separated from a base of the component-mounting device according to the embodiment of the present disclosure.

In FIG. 5, carriage-side connector 14C protruding toward a center of base 11 is provided in the base-side end portion of feeder carriage 14. Base-side connector 11C is provided on a side of base 11, and in a state where feeder carriage 14 is connected to base 11, carriage-side connector 14C is fitted into base-side connector 11C.

When carriage-side connector 14C is fitted into base-side connector 11C, each part feeder 15 attached to feeder carriage 14 is electrically connected to controller 20 (FIG. 3)

provided in base 11 via feeder carriage 14. When part feeder 15 is electrically connected to controller 20, an operation of part feeder 15 can be controlled by controller 20.

Figure 6:
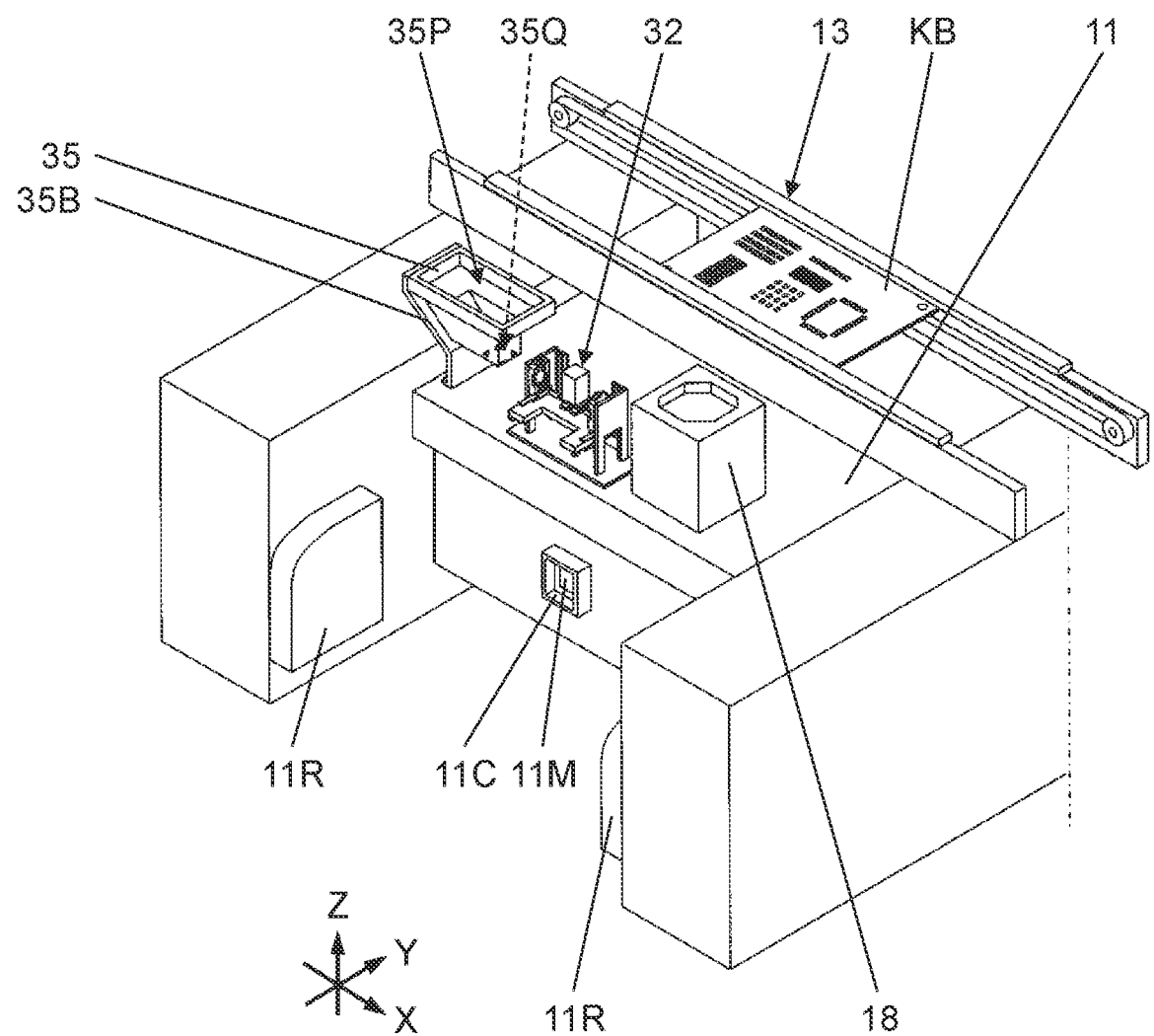
FIG. 6 is a perspective view of a portion of the base of the component-mounting device according to the embodiment of the present disclosure.

In FIGS. 5 and 6, base 11 includes carriage detection sensor 11M which detects a state where carriage-side connector 14C is fitted into base-side connector 11C. Controller 20 detects that feeder carriage 14 is located at a position connectable to base 11 based on an output of carriage detection sensor 11M.

In FIGS. 2, 5 and 6, a pair of right and left carriage lockers 11R is provided at portions located on the right and left sides of feeder carriage 14 to which base 11 is connected. Carriage locker 11R functions as a connection mechanism which mechanically holds feeder carriage 14. When carriage detection sensor 11M detects that feeder carriage 14 reaches at a connectable position, carriage locker 11R is controlled by controller 20 to operate the connection mechanism so as to lock feeder carriage 14 to base 11. Accordingly, feeder carriage 14 is connected to base 11. When feeder carriage 14 is locked to base 11 by carriage locker 11R, operator OP cannot separate feeder carriage 14 from base 11 unless the lock is released. As connection mechanism, a carriage positioning mechanism described in Japanese Patent Unexamined Publication No. 2009-71029 can be applied. Of course, other connection mechanisms can also be applied.

In FIGS. 1, 2, and 3, head movement mechanism 16 is installed on base 11. As illustrated in FIGS. 2 and 3, head movement mechanism 16 includes stationary beam 16a, two movable beams 16b located on the front and rear sides, and two head holding plates 16c located on the front and rear sides.

Each of stationary beams 16a has a shape extending in the Y-axis direction and is installed on base 11. Each of two movable beams 16b has a shape extending in the X-axis direction, and one end side of movable beam 16b is movable along stationary beam 16a (that is, movable in the Y-axis direction). Front-side head holding plate 16c of two head holding plates 16c is attached to front-side movable beam 16b and freely moves in the X-axis direction along front-side movable beam 16b. Rear-side head holding plate 16c of two head holding plates 16c is attached to rear-side movable beam 16b and freely moves in the X-axis direction along rear-side movable beam 16b.

Two mounting heads 17 include front-side mounting head 17 and rear-side mounting head 17. Front-side mounting head 17 is attached to front-side head holding plate 16c, and rear-side mounting head 17 is attached to rear-side head holding plate 16c.

Front-side mounting head 17 is moved in working space 11S (mainly the front side of working space 11S) in an XY in-plane direction by a movement of front-side movable beam 16b with respect to stationary beam 16a in the Y-axis direction and a movement of front-side head holding plate 16c with respect to front-side movable beam 16b in the X-axis direction. Rear-side mounting head 17 is moved horizontally in working space 11S (mainly the rear side of working space 11S) by a movement of the rear-side movable beam 16b with respect to stationary beam 16a in the Y-axis direction and a movement of rear-side head holding plate 16c with respect to rear-side movable beam 16b in the X-axis direction.

The movement of front-side mounting head 17 and the movement of rear-side mounting head 17 are performed separately and independently within a range where the movements do not interfere with each other. Front-side mounting head 17 includes a front-side equipment installation region in a movable range of front-side mounting head 17, and rear-side mounting head 17 includes a rear-side equipment installation region in a movable range of rear-side mounting head 17.

Figure 7:
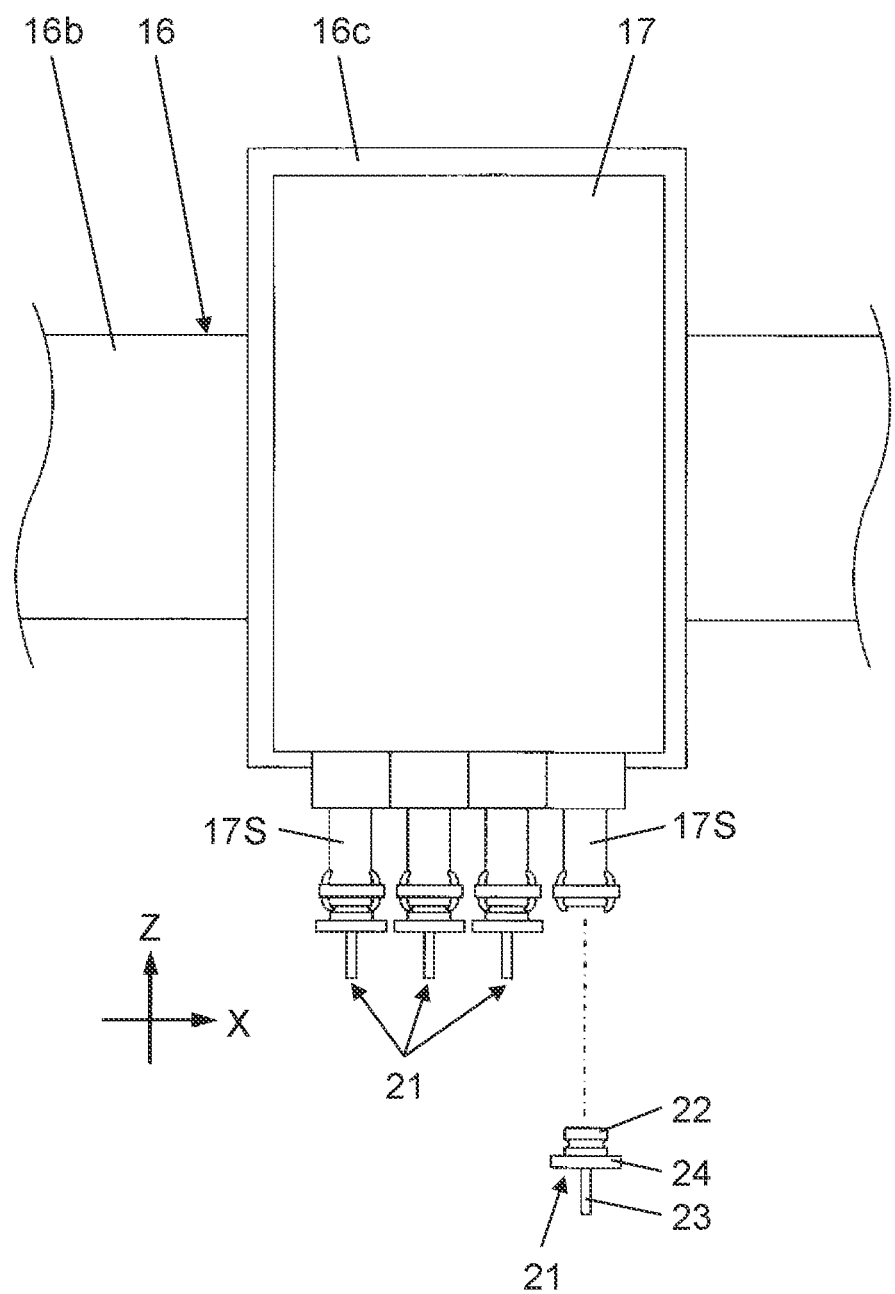
FIG. 7 is a front view of a mounting head included in the component-mounting device according to the embodiment of the present disclosure.

In FIGS. 3 and 7, each of two mounting heads 17 includes plurality of nozzle shafts 17S extending downward. Nozzle 21 is detachably attached to a lower end of each nozzle shaft 17S. Each nozzle shaft 17S (that is, each nozzle 21) is movable up and down with respect to mounting head 17 and rotatable about a vertical axis.

In FIG. 7, each nozzle 21 includes base portion 22, tubular portion 23, and flange portion 24. Base portion 22 is a tubular portion which is externally fitted to lower end of nozzle shaft 17S. Tubular portion 23 is a tubular portion having an internal conduit communicating with an inside of base portion 22. Flange portion 24 is a disk-shaped portion located between base portion 22 and tubular portion 23.

In a state where base portion 22 is externally fitted to the lower end of nozzle shaft 17S, tubular portion 23 extends downward from base portion 22, and flange portion 24 extends horizontally. When a vacuum pressure is supplied to nozzle 21 through nozzle shaft 17S, a suction force is generated at the lower end (the lower end of tubular portion 23) of nozzle 21.

Mounting head 17 can suck component BH supplied to component supply port 15K by part feeder 15 using the suction force generated at the lower end of nozzle 21. Front-side mounting head 17 sucks component BH supplied by part feeder 15 connected to the front side of base 11, and rear-side mounting head 17 sucks component BH supplied by part feeder 15 connected to the rear side of base 11.

When mounting head 17 sucks component BH from part feeder 15, mounting head 17 moves so that nozzle 21 is located above component supply port 15K of part feeder 15 and lowers nozzle shaft 17S. Then, a lower end of tubular portion 23 of nozzle 21 is brought close to component BH supplied to component supply port 15K to suck air. Accordingly, component BH supplied to component supply port 15K is sucked by nozzle 21, and component BH is picked up by mounting head 17.

In FIGS. 2 and 3, two component cameras 18 include front-side component camera 18 and rear-side component camera 18. Front-side component camera 18 is provided in the front-side equipment installation region of base 11 (refer to also FIG. 4), and rear-side component camera 18 is provided in the rear-side equipment installation region of base 11.

In FIG. 4, each of two component cameras 18 has an imaging visual field directed upward, and images component BH sucked by mounting head 17 using nozzle 21 from below. Front-side component camera 18 images component BH sucked by front-side mounting head 17, and rear-side component camera 18 images component BH sucked by rear-side mounting head 17.

In FIG. 3, controller 20 controls each of the operation of transferring or positioning board KB by two transfer conveyors 13, the operation of supplying component BH by each part feeder 15, and the operation of moving two mounting heads 17 by head movement mechanism 16. Controller 20 controls each of the operations of raising and lowering nozzle shaft 17S (nozzle 21) of each of two mounting heads 17 and rotating nozzle shaft 17S about the vertical axis, the operation of sucking component BH by each nozzle 21, and the operation of locking or unlocking feeder carriage 14 with respect to base 11 by carriage locker 11R. Controller 20 controls the imaging operation of two component cameras 18 and recognizes component BH based on an image of component BH obtained by the imaging of each component camera 18. Controller 20 also controls the operation of each of front-side replacement table holder 32 and rear-side replacement table holder 32, which will be described later.

In FIGS. 1 and 2, touch panel TP is provided in each of the front side and the rear side of base cover 12. Each touch panel TP has a function which serves as both an input unit which receives an input operation to controller 20 and an output unit which displays an output from controller 20.

As described above, base cover 12 includes front-side door 12C and rear-side door 12C, and operator OP can insert his/her hand into working space 11S through an opening formed by opening door 12C. Therefore, operator OP can perform an inspection operation or the like of the equipment disposed on base 11.

Controller 20 constantly monitors an open/closed state of each of front and rear doors 12C, and in a case where door 12C is opened when component-mounting device 1 performs a component mounting operation, controller 20 stops an operation of an operation mechanism units such as transfer conveyor 13, part feeder 15, head movement mechanism 16, mounting head 17, or the like so that all component mounting operations are stopped. Such a safety device is provided from the viewpoint of ensuring safety of operator OP, and in a case where at least one of front-side door 12C and rear-side door 12C is open, controller 20 stops the operations of all the operation mechanism units.

In a case where component-mounting device 1 mounts component BH on board KB to produce a mount board, and each of front-side transfer conveyor 13 and rear-side transfer conveyor 13 is operated by the control of controller 20, receives and transfers board KB fed from a device on an upstream process side, and positions board KB at the working position. When each transfer conveyor 13 positions board KB at the working position, head movement mechanism 16 moves each of front-side mounting head 17 and rear-side mounting head 17 to mount component BH on board KB.

In this case, front-side mounting head 17 mounts component BH on board KB positioned by front-side transfer conveyor 13, and rear-side mounting head 17 mounts component BH on board KB positioned by rear-side transfer conveyor 13. It should be noted that this is a basic operation, and components BH can be mounted on both board KB positioned by front-side transfer conveyor 13 and board KB positioned by rear-side transfer conveyor 13 by both front-side mounting head 17 and rear-side mounting head 17.

The mount board is produced by repeating the component mounting operation. However, it is necessary to replace nozzle 21 of mounting head 17 according to a shape or a size of component BH. Accordingly, component-mounting device 1 includes nozzle replacement table 31 holding replacement nozzle 21. As illustrated in FIGS. 1 and 2, replacement table holder 32 is provided on each of the front side and the rear side of base 11, and nozzle replacement table 31 is held by each of front-side replacement table holder 32 and rear-side replacement table holder 32.

In FIGS. 1 and 2, front-side replacement table holder 32 is provided in the front-side equipment installation region of base 11 (refer to also FIGS. 4 and 6), and holds front-side nozzle replacement table 31 so that front-side nozzle replacement table 31 is located in the front-side equipment installation region (that is, within the movable range of front-side mounting head 17). Rear-side replacement table holder 32 is provided in the rear-side equipment installation region of base 11, and holds rear-side nozzle replacement table 31 so that rear-side nozzle replacement table 31 is located in the rear-side equipment installation region (that is, within the movable range of rear-side mounting head 17).

In FIGS. 1 and 2, component discard box 33 is installed in each of the front-side equipment installation region and the rear-side equipment installation region. Component discard box 33 has a box shape which opens upward (refer to also FIG. 4).

During the component mounting operation by component-mounting device 1, in a case where mounting head 17 images component BH sucked by nozzle 21 using component camera 18 and a normal recognition result is not obtained, component BH is input in component discard box 33 as a discarded component without being mounted on board KB. The discarded component is input from front-side mounting head 17 into front-side component discard box 33, and the discarded component is input from rear-side mounting head 17 into rear-side component discard box 33.

Figure 8:
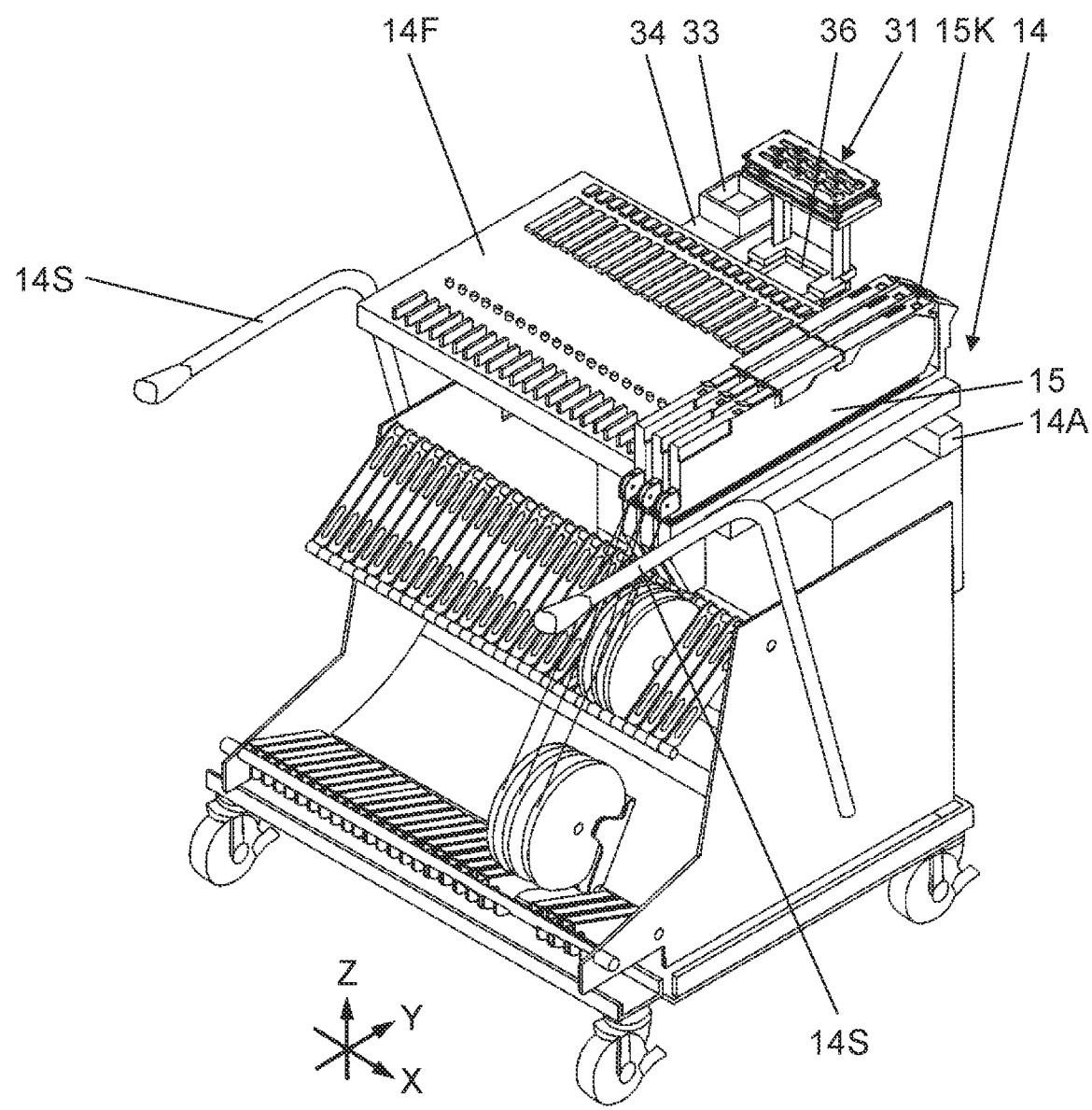
FIG. 8 is a perspective view of the feeder carriage included in the component-mounting device according to the embodiment of the present disclosure.
Figure 9:
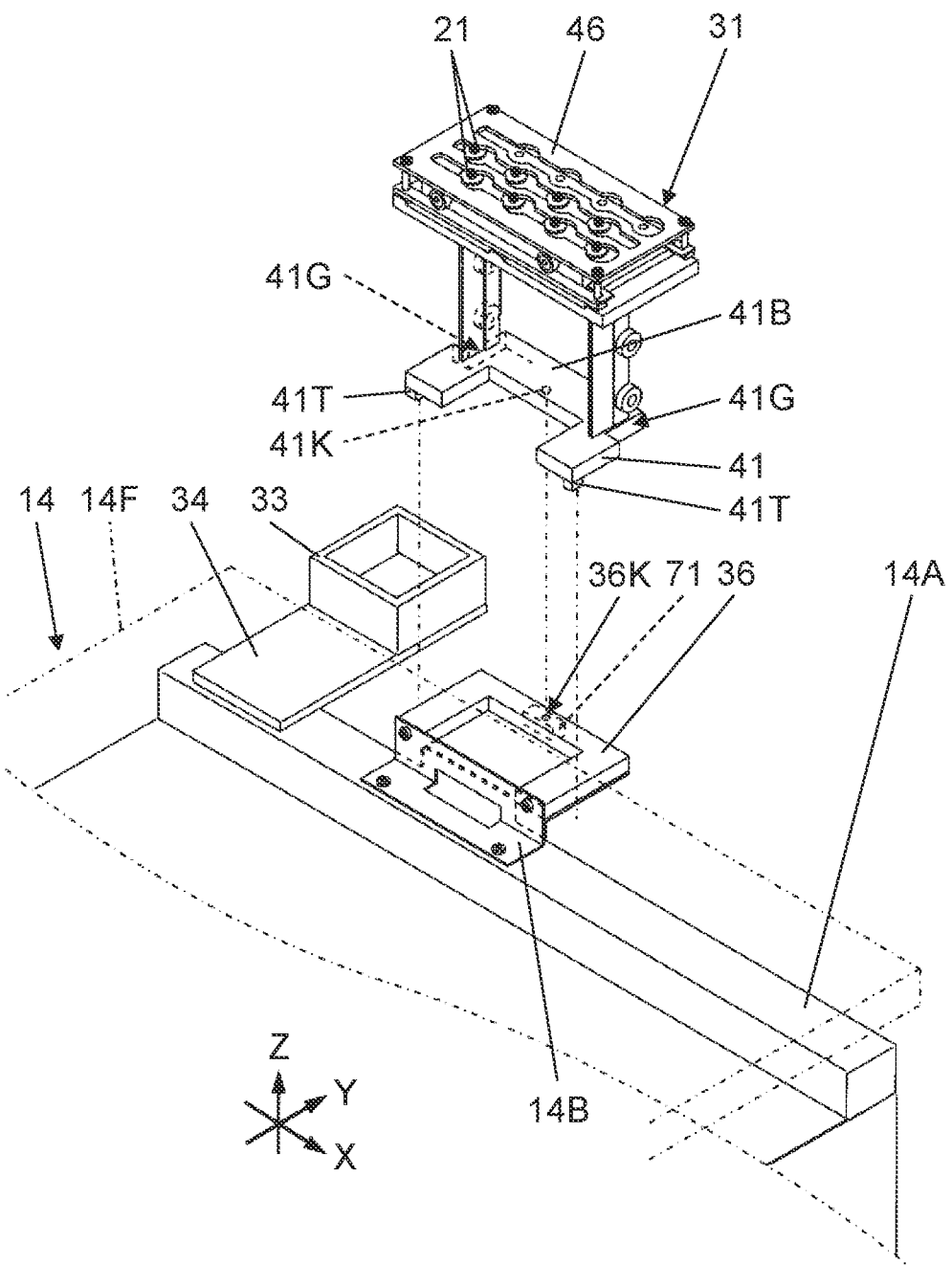
FIG. 9 is a perspective view illustrating a state in which a nozzle replacement table is separated from a placing table of the feeder carriage included in the component-mounting device according to the embodiment of the present disclosure.

In FIGS. 4, 8 and 9, carrier holding member 14A is provided on the base-side end portion of feeder carriage 14 so as to extend in the X-axis direction. A base portion of box holding member 34 which is a carrier of component discard box 33 is attached to carrier holding member 14A. Box holding member 34 extends toward a side of the center portion of base 11, and box holding member 34 is detachably held at a distal end portion thereof. Box holding member 34 is located at a position protruding toward base 11 side from feeder base 14F, in other words, at a position protruding toward transfer conveyor 13 side serving as a board positioner with respect to feeder base 14F. The distal end portion of box holding member 34 is located in the equipment installation region of base 11 in a state where feeder carriage 14 is connected to base 11. Accordingly, in the state where feeder carriage 14 is connected to base 11, component discard box 33 is located in the equipment installation region (that is, in the movable region of mounting head 17) of base 11 (FIG. 4).

In FIGS. 2 and 4, shooter 35 is provided in each of the front-side equipment installation region of base 11 and the rear-side equipment installation region of base 11. As illustrated in FIG. 6 as well, shooter 35 has a tubular shape as a whole, and has input port 35P opened upward and discharge port 35Q opened downward. Shooter 35 is attached to base 11 via shooter bracket 35B attached to base 11, and shooter 35 is fixed relative to base 11. An opening area of input port 35P is larger than an opening area of discharge port 35Q.

When the discarded component is discarded into component discard box 33, mounting head 17 inputs the discarded component into input port 35P of shooter 35. The discarded component which has been input into input port 35P of shooter 35 is discharged from discharge port 35Q and is accommodated (discarded) in component discard box 33.

In FIG. 9, in addition to above-described box holding member 34, placing table 36 which is a carrier of nozzle replacement table 31 is attached to carrier holding member 14A provided in feeder carriage 14, via bracket 14B. Placing table 36 has a shape spreading in an XY plane, and nozzle replacement table 31 before being held by replacement table holder 32 is placed (temporarily placed) on placing table 36. An upper surface of placing table 36 includes fitting hole 36K which is recessed downward. Similar to above-described box holding member 34, placing table 36 is located at a position protruding toward base 11 from feeder base 14F, in other words, at a position protruding toward transfer conveyor 13 serving as a board positioner from feeder base 14F.

Figure 10A:
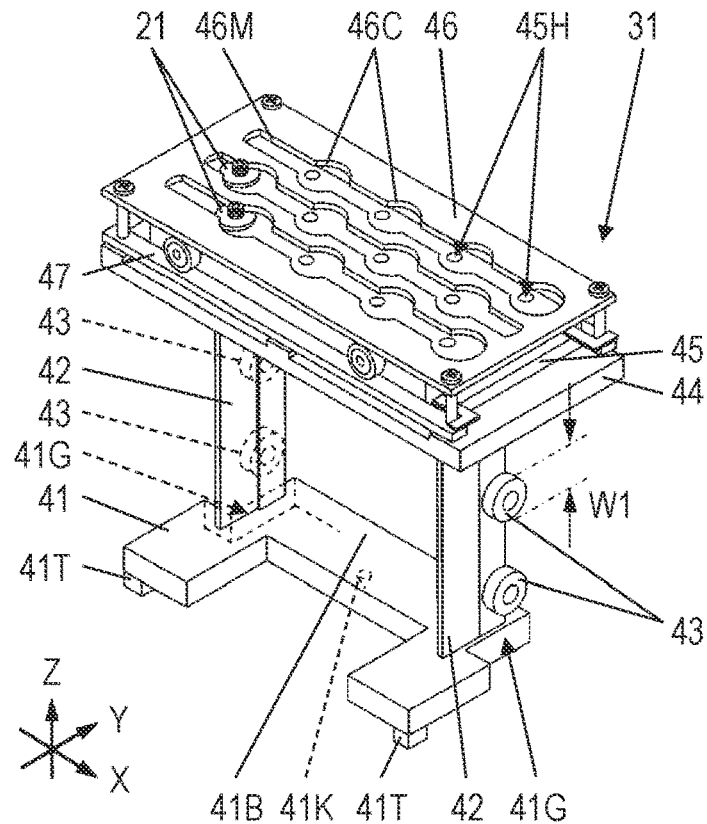
FIG. 10A is a perspective view of the nozzle replacement table included in the component-mounting device according to the embodiment of the present disclosure.
Figure 10B:
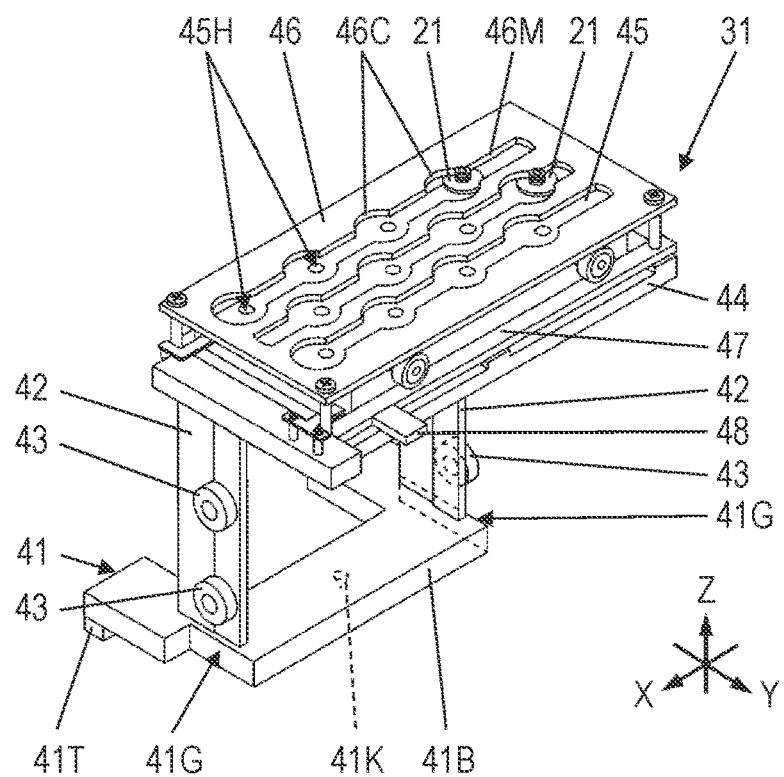
FIG. 10B is a perspective view of the nozzle replacement table included in the component-mounting device according to the embodiment of the present disclosure.

FIGS. 10A and 10B illustrate nozzle replacement table 31. Here, front-side nozzle replacement table 31 is illustrated.

However, a configuration of rear-side nozzle replacement table 31 is similar. In FIGS. 10A and 10B, nozzle replacement table 31 includes pedestal 41, two columns 42, four rollers 43, base portion 44, nozzle support 45, and shutter 46. Positioning protrusion 41K protruding downward is provided at a center of a lower surface of pedestal 41 (refer to also FIG. 9). Positioning protrusion 41K has a shape which can be fitted into fitting hole 36K provided on an upper surface of placing table 36 from above.

In FIGS. 10A and 10B, two guide protrusions 41T protruding downward are provided at both end portions of pedestal 41 in the X-axis direction (refer to also FIG. 9). A distance between two guide protrusions 41T is slightly larger than a length of placing table 36 in the X-axis direction. A length of a base-side half portion (referred to as pedestal inner portion 41B) of pedestal 41 in the X-axis direction is smaller than a length of a half portion in front of the base-side half portion in the X-axis direction. Both side surfaces of pedestal inner portion 41B in the X-axis direction are guided surfaces 41G parallel to a YZ plane.

In FIGS. 10A and 10B, two columns 42 are provided at both end portions of the upper surface of pedestal 41 in the X-axis direction so as to face each other in the X-axis direction, and extend in the Z-axis direction. Two of four rollers 43 are provided to be arranged in the Z-axis direction on an outer side surface of each of two columns 42. Base portion 44 has a shape spreading in the XY plane, and a lower surface of base portion 44 is supported by two columns 42.

In FIGS. 10A and 10B, nozzle support 45 is constituted by a block-shaped member and is provided on a side of an upper surface of base portion 44. In nozzle support 45, plurality of nozzle insertion holes 45H which are opened on an upper surface are provided in a matrix form (refer to also FIGS. 11A and 11B). An inner diameter of each nozzle insertion hole 45H is slightly larger than an outer diameter of tubular portion 23 of nozzle 21.

In FIGS. 10A and 10B, shutter 46 is constituted by a rectangular flat plate member spreading in the XY plane. Shutter 46 is located above nozzle support 45 and is slidable in the X-axis direction with respect to nozzle support 45. Shutter 46 has plurality of circular holes 46C provided in the same arrangement as plurality of nozzle insertion holes 45H provided in nozzle support 45 (refer to also FIGS. 11A and 11B).

An inner diameter of each circular hole 46C included in shutter 46 is larger than an inner diameter of nozzle insertion hole 45H of nozzle support 45 and is larger than an outer diameter of flange portion 24 of nozzle 21. Plurality of circular holes 46C arranged in the X-axis direction are penetrated by groove 46M extending in the X-axis direction (refer to also FIGS. 11A and 11B). A width (dimension in the Y-axis direction) of each groove 46M is smaller than an outer diameter of flange portion 24 of nozzle 21 and is larger than an outer diameter of base portion 22 of nozzle 21.

Figure 11A:
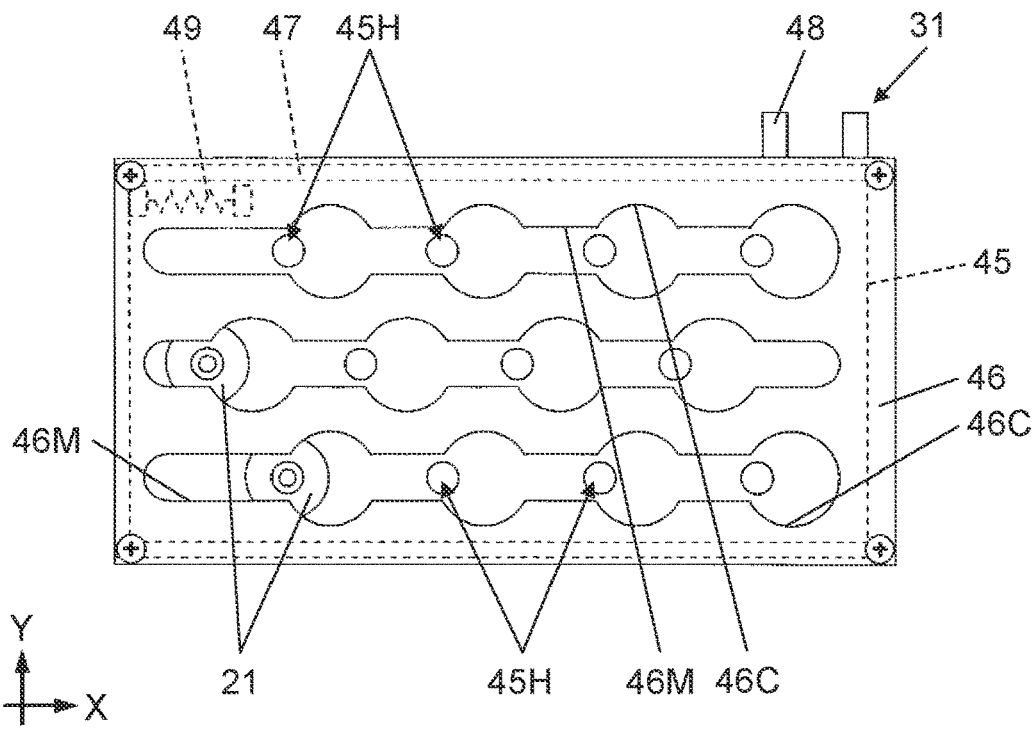
FIG. 11A is a plan view of the nozzle replacement table included in the component-mounting device according to the embodiment of the present disclosure.
Figure 11B:
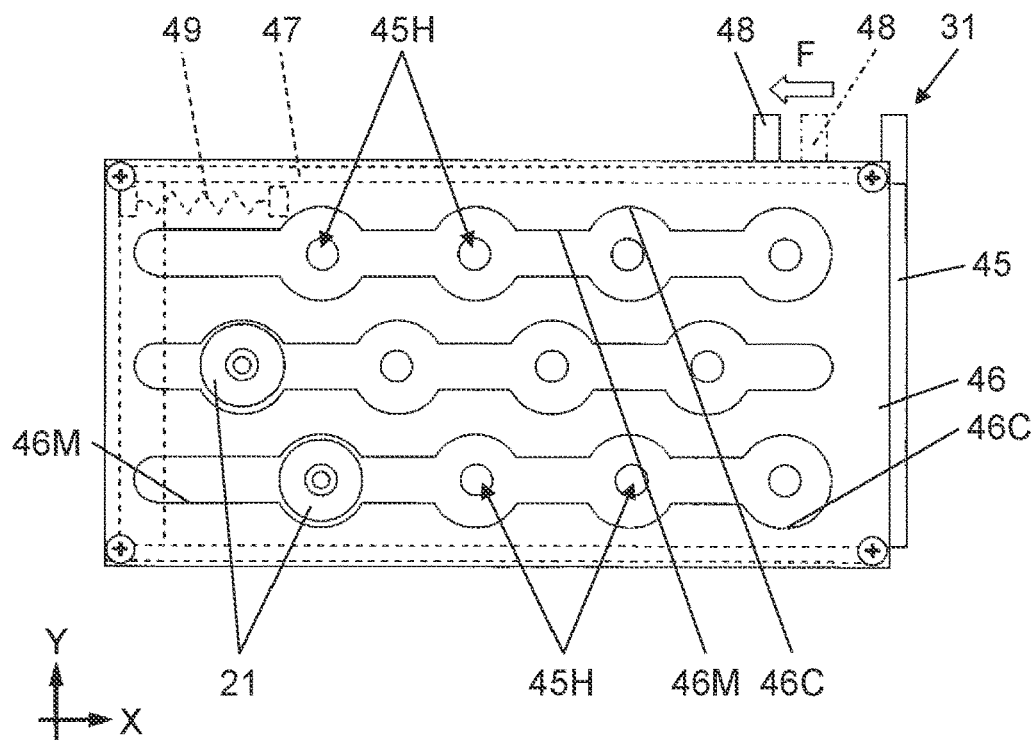
FIG. 11B is a plan view of the nozzle replacement table included in the component-mounting device according to the embodiment of the present disclosure.

In FIGS. 10A and 10B and FIGS. 11A and 11B, frame-shaped member 47 which is coupled to shutter 46 and moves integrally with shutter 46 in the X-axis direction is provided below shutter 46. Operated piece 48 which protrudes and extends toward the center portion side of base 11 is provided at an end portion of frame-shaped member 47 on the center portion side of base 11 (FIGS. 10B, 11A, and 11B). In FIGS. 11A and 11B, for example, biasing member 49 constituted by a tension spring is provided between frame-shaped member 47 and nozzle support 45. Biasing member 49 biases frame-shaped member 47 (that is, shutter 46) in the X-axis direction with respect to nozzle support 45.

Shutter 46 is biased by biasing member 49 and is located at a closed position (FIG. 11A) in a state where a force is not applied to operated piece 48. In a state where shutter 46 is located at the closed position, a center of each of plurality of circular holes 46C provided in shutter 46 is located at a position displaced in the X-axis direction with respect to a center of each nozzle insertion hole 45H provided in nozzle support 45 (FIG. 11A).

When operated piece 48 is operated in the X-axis direction (in the left direction in FIGS. 11A and 11B) against the biasing force of biasing member 49 from the state where shutter 46 is located at the closed position (arrow F illustrated in FIG. 11B), shutter 46 which is integrated with operated piece 48 slides in the operating direction via frame-shaped member 47. Then, shutter 46 is located at an open position which is displaced from the closed position in the X-axis direction (FIG. 11A→FIG. 11B).

In the state where shutter 46 is located at the open position (FIG. 11B), the center of each of plurality of circular holes 46C provided in shutter 46 coincides with the center of each nozzle insertion hole 45H provided in nozzle support 45. In the state where shutter 46 is located at the open position, tubular portion 23 of nozzle 21 can be inserted from above into nozzle insertion hole 45H of nozzle support 45 through circular hole 46C of shutter 46, and nozzle 21 of which the tubular portion 23 is inserted into nozzle insertion hole 45H can be pulled out upward.

When the operating force for operating operated piece 48 in the X-axis direction is removed from the state where shutter 46 is located at the open position, shutter 46 is biased by biasing member 49 and is returned to the closed position (FIG. 11B→FIG. 11A). In the state where shutter 46 is located at the closed position (FIG. 11A), flange portion 24 of nozzle 21 of which tubular portion 23 is inserted into nozzle insertion hole 45H interferes with the lower surface of shutter 46, and thus, nozzle 21 cannot be pulled out upward. Therefore, nozzle 21 inserted into nozzle insertion hole 45H does not fall off nozzle replacement table 31 in the state where shutter 46 is located at the closed position.

Figure 12:
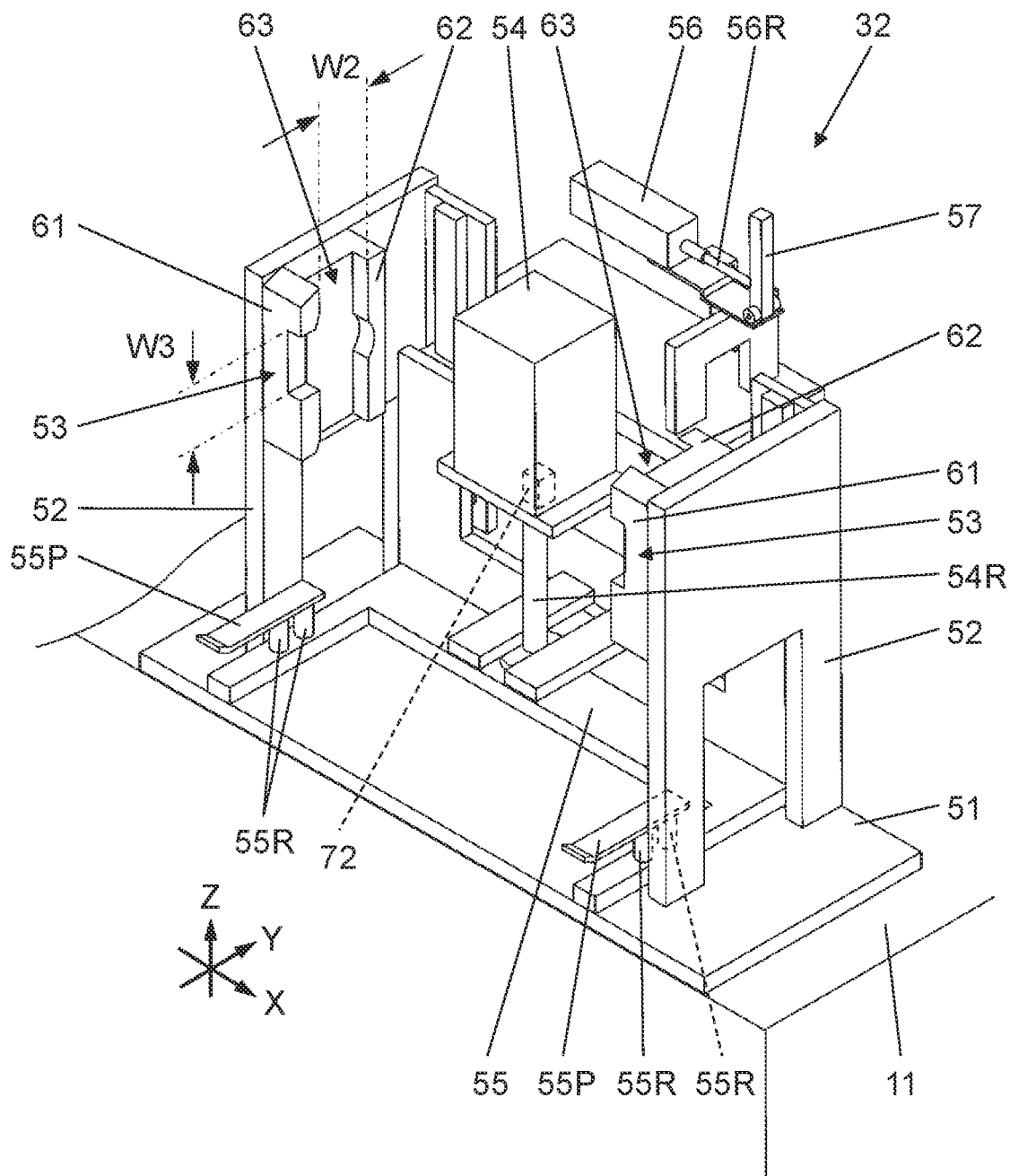
FIG. 12 is a perspective view of a replacement table holder included in the component-mounting device according to the embodiment of the present disclosure.

FIG. 12 illustrates replacement table holder 32. Here, front-side replacement table holder 32 is illustrated. However, rear-side replacement table holder 32 has the same configuration. In FIG. 12, replacement table holder 32 includes base plate 51, two support plates 52, two roller guides 53, raising/lowering cylinder 54, raising/lowering plate 55, shutter operating cylinder 56, and shutter operator 57 serving as a movable portion operating unit. Base plate 51 is constituted by a flat plate-shaped member. Two support plates 52 are provided at both end portions of base 11 in the X-axis direction so as to face each other in the X-axis direction, and extend in the Z-axis direction. Each of two roller guides 53 is provided on an inner surface (a surface on a side where support plates 52 face each other in the X-axis direction) side of each of two support plates 52.

Figure 13:
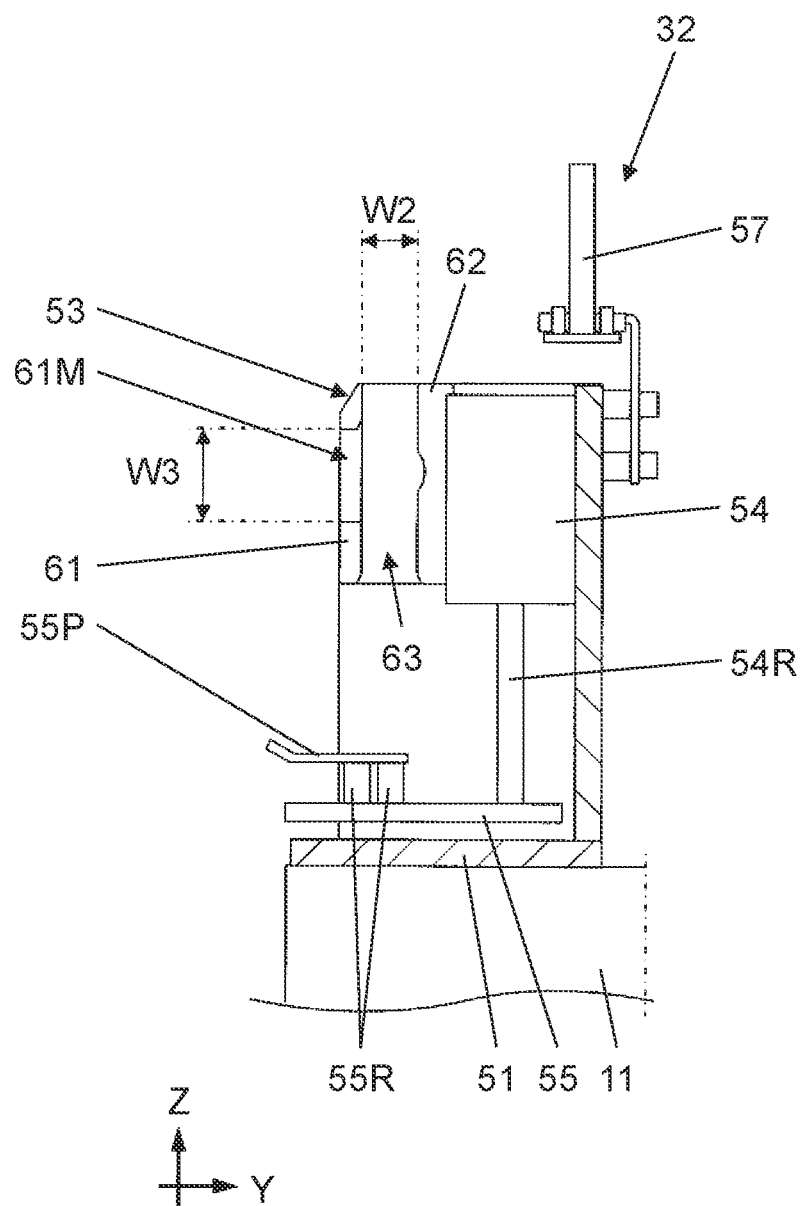
FIG. 13 is a cross-sectional view of a portion of the replacement table holder included in the component-mounting device according to the embodiment of the present disclosure.

In FIGS. 12 and 13, each of two roller guides 53 has front wall 61 and rear wall 62 located on the center portion side of base 11 of front wall 61. A space between front wall 61 and rear wall 62 is guide groove 63 extending in the Z-axis direction. Guide groove 63 has lateral width W2 (FIGS. 12 and 13) which is slightly larger than outer diameter W1 (FIG. 10A) of roller 43. In front wall 61, groove portion 61M penetrating front wall 61 in the Y-axis direction is provided to extend in the Z-axis direction (FIG. 13). Vertical width W3 (FIGS. 12 and 13) of groove portion 61M is larger than outer diameter W1 of roller 43.

In FIGS. 12 and 13, raising/lowering cylinder 54 serving as vertically moving mechanism configured to raise or lower nozzle replacement table 31 is provided with raising/lowering rod 54R, which is a piston rod of raising/lowering cylinder 54, facing downward. Raising/lowering plate 55 is a member which supports pedestal 41 of nozzle replacement table 31 from below, and is connected to a lower end of raising/lowering rod 54R. Raising/lowering plate 55 moves (is raised or lowered) in the Z-axis direction when raising/lowering cylinder 54 operates raising/lowering rod 54R.

In FIG. 12, two guide rollers 55R extending in the Z-axis direction and rotatable about the Z-axis are provided to be arranged in the Y-axis direction at each of both end portions of an upper surface of raising/lowering plate 55 in the X-axis direction. (refer to also FIG. 13). Retaining member 55P is provided above right and left two guide rollers 55R (two guide rollers 55R arranged in the Y-axis direction) of four guide rollers 55R, so as to extend in the Y-axis direction. An interval (interval in the X-axis direction) between two guide rollers 55R facing each other in the X-axis direction is slightly larger than the width in the X-axis direction of pedestal inner portion 41B of nozzle replacement table 31. Further, the distance (the distance in the Z-axis direction) between the upper surface of base plate 51 and the lower surface of each retaining member 55P is slightly larger than a dimension in a thickness direction of pedestal inner portion 41B of nozzle replacement table 31.

In FIG. 12, shutter operating cylinder 56 is provided at a position on the center portion side of base 11 from raising/lowering cylinder 54, in a posture in which shutter operating rod 56R which is a piston rod thereof is directed in the X-axis direction. Shutter operator 57 extends in the Z-axis direction, and a lower end of shutter operator 57 is connected to a distal end portion of shutter operating rod 56R. When shutter operating cylinder 56 operates shutter operating rod 56R, shutter operator 57 moves in the X-axis direction while maintaining a posture in which shutter operator 57 extends in the Z-axis direction.

Figure 14:
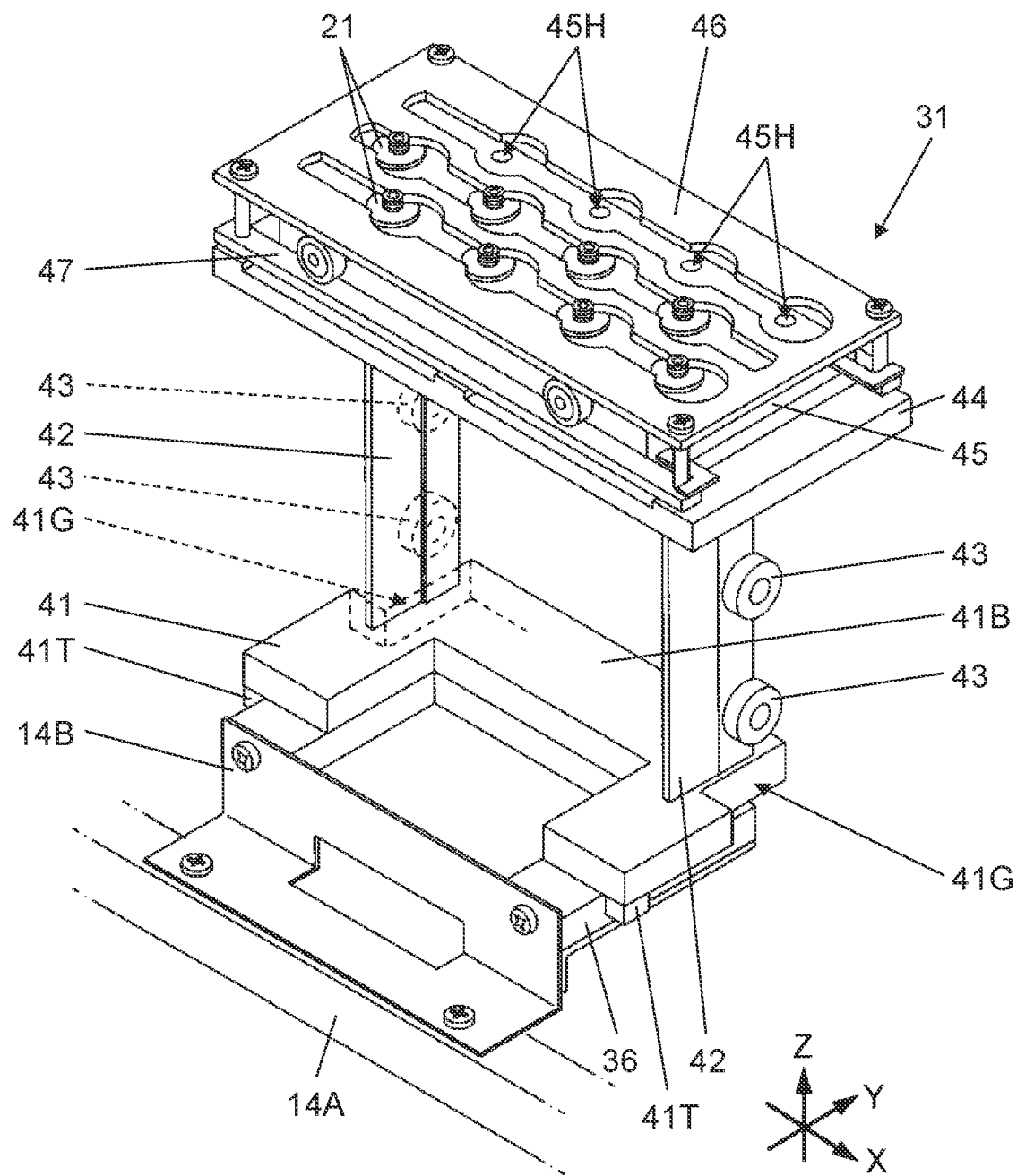
FIG. 14 is a perspective view illustrating a state in which the nozzle replacement table included in the component-mounting device according to the embodiment of the present disclosure is placed on the placing table.

In a case where feeder carriage 14 is connected to base 11 and held by replacement table holder 32 (that is, nozzle replacement table 31 is installed on base 11), first, nozzle replacement table 31 is placed on placing table 36 attached to carrier holding member 14A of feeder carriage 14. When nozzle replacement table 31 is placed on placing table 36, pedestal 41 of nozzle replacement table 31 is placed on an upper surface of placing table 36 (FIG. 9→FIG. 14). In this case, positioning protrusion 41K on the lower surface of pedestal 41 is fitted into fitting hole 36K of placing table 36 from above, and placing table 36 is positioned between two guide protrusions 41T. As a result, nozzle replacement table 31 is located at a specified position with respect to placing table 36 (FIG. 14).

After nozzle replacement table 31 is placed on placing table 36, operator OP causes feeder carriage 14 to travel on a floor and transfers feeder carriage 14 to base 11. Accordingly, carriage-side connector 14C of feeder carriage 14 is fitted into base-side connector 11C. When the fitting is detected by carriage detection sensor 11M, carriage locker 11R controlled by controller 20 locks feeder carriage 14 to base 11 and connects feeder carriage 14 to base 11. When feeder carriage 14 is connected to base 11, nozzle replacement table 31 placed on placing table 36 is transferred to replacement table holder 32 in a region between part feeder 15 attached to feeder carriage 14 and replacement table holder 32.

Figure 15:
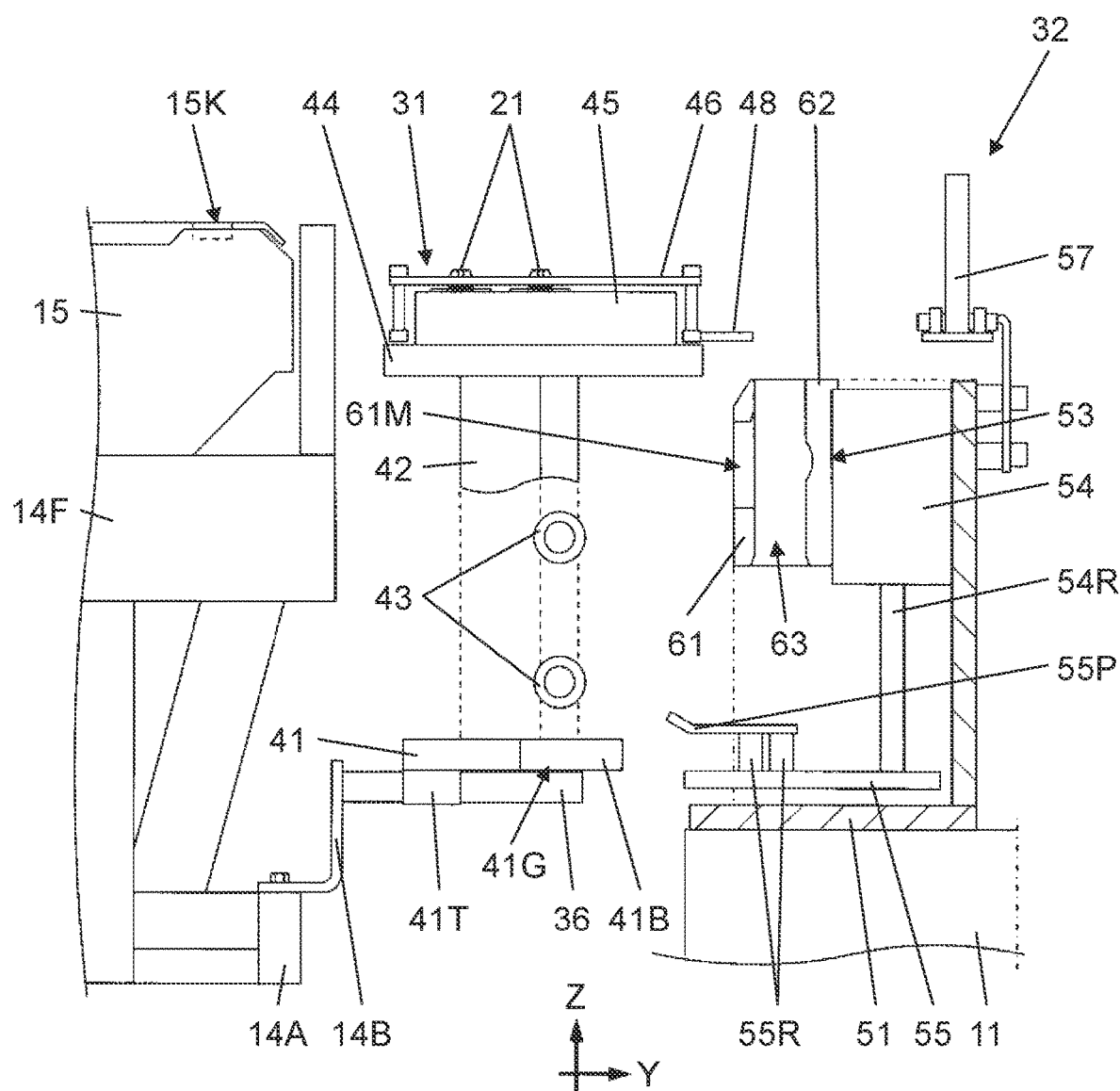
FIG. 15 is a side view illustrating a state of a process in which the nozzle replacement table is held by the replacement table holder of the component-mounting device according to the embodiment of the present disclosure.
Figure 16:
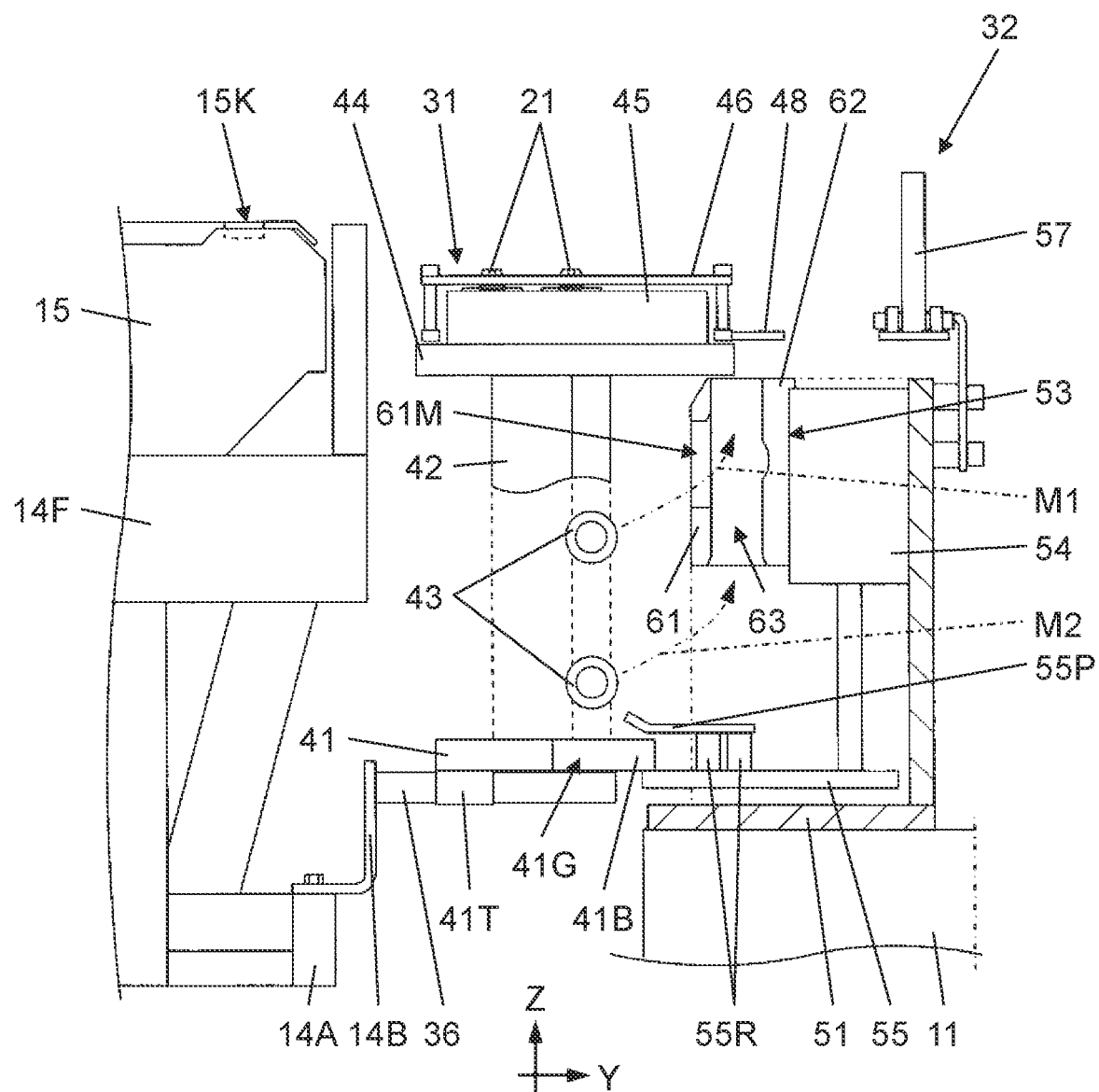
FIG. 16 is a side view illustrating a state of a process in which the nozzle replacement table is held by the replacement table holder of the component-mounting device according to the embodiment of the present disclosure.
Figure 17:
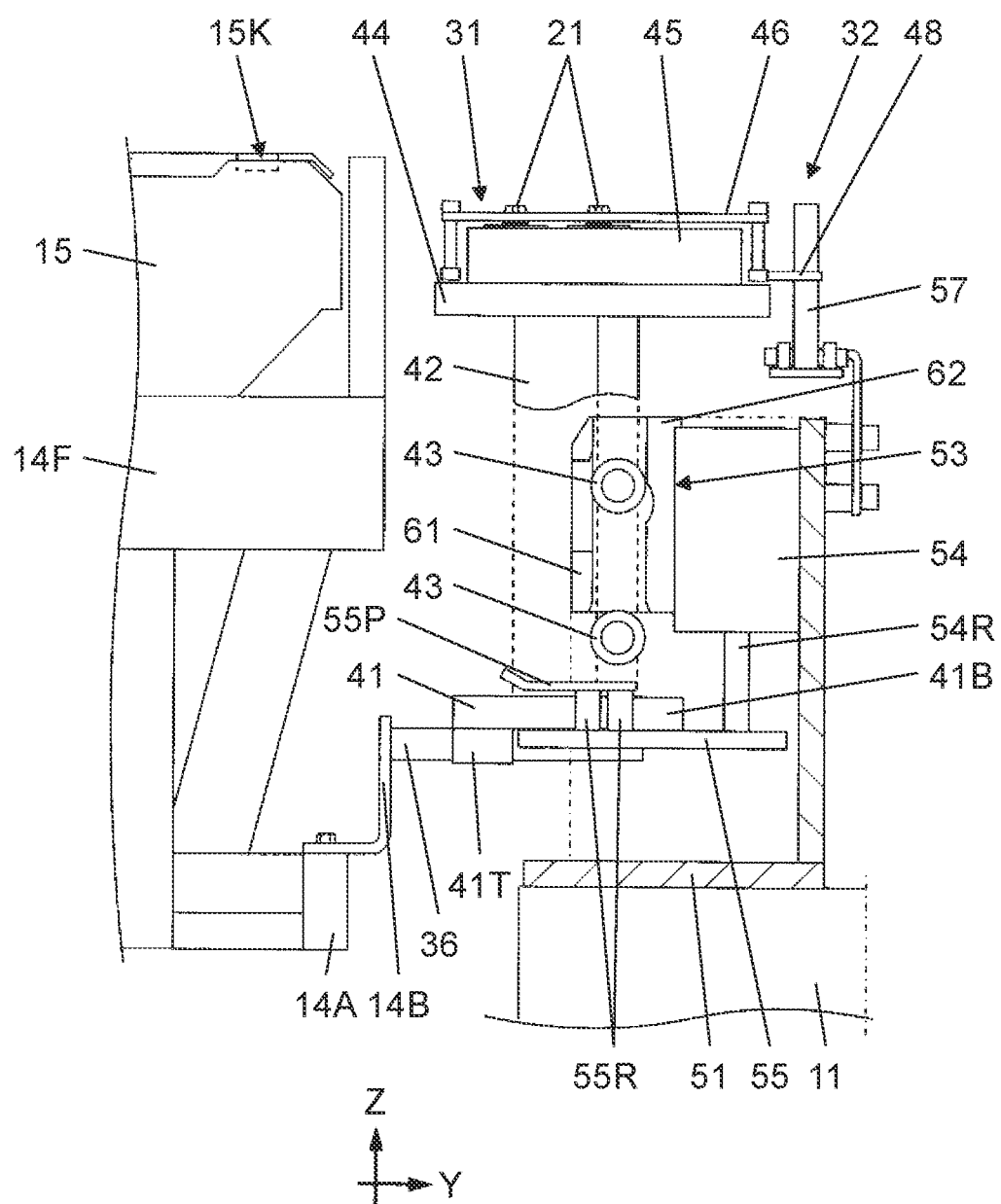
FIG. 17 is a side view illustrating a state of a process in which the nozzle replacement table is held by the replacement table holder of the component-mounting device according to the embodiment of the present disclosure.

When feeder carriage 14 is pushed into base 11, pedestal inner portion 41B of nozzle replacement table 31 placed on placing table 36 enters a space between raising/lowering plate 55 of replacement table holder 32 and retaining member 55P. (FIG. 15→FIG. 16→FIG. 17). Accordingly, replacement table holder 32 receives nozzle replacement table 31 from placing table 36. When pedestal inner portion 41B of nozzle replacement table 31 enters between raising/lowering plate 55 of replacement table holder 32 and the retaining member, two guided surfaces 41G at both ends of pedestal inner portion 41B of nozzle replacement table 31 are guided from the side (X-axis direction) by four (two on the left and two on the right) guide rollers 55R included in replacement table holder 32.

Pedestal inner portion 41B of nozzle replacement table 31 which has entered between raising/lowering plate 55 and retaining member 55P as described above is raised by a small amount while pressing retaining member 55P upward. Therefore, nozzle replacement table 31 moves obliquely upward toward the center portion side of base 11 with respect to replacement table holder 32 while raising raising/lowering plate 55 (FIG. 16→FIG. 17).

When nozzle replacement table 31 moves diagonally upward toward the center portion side of base 11 with respect to replacement table holder 32, right and left upper and lower rollers 43 enter guide grooves 63 of right and left two roller guides 53 included in replacement table holder 32. (FIG. 16→FIG. 17 and refer to arrows M1 and M2 illustrated in FIG. 16). Specifically, upper roller 43 of upper and lower rollers 43 enters guide groove 63 through groove portion 61M provided in front wall 61 (arrow M1), and lower roller 43 enters guide groove 63 from below lower front wall 61 (arrow M2).

Entry of right and left upper and lower rollers 43 into guide grooves 63 of right and left roller guides 53 is completed when feeder carriage 14 is connected to base 11. When feeder carriage 14 is locked to base 11 by carriage locker 11R and is connected to base 11, raising/lowering cylinder 54 raises raising/lowering plate 55. Accordingly, nozzle replacement table 31 is raised by raising/lowering cylinder 54 via raising/lowering plate 55 (FIGS. 17→18), and pedestal 41 of nozzle replacement table 31 is separated from raising/lowering plate 55 of replacement table holder 32 (hence, mechanically separated from feeder carriage 14) and moved upwards. Then, when nozzle replacement table 31 reaches a position of a predetermined height corresponding to the above-described holding position, raising/lowering cylinder 54 stops the raising of raising/lowering plate 55.

Figure 18:
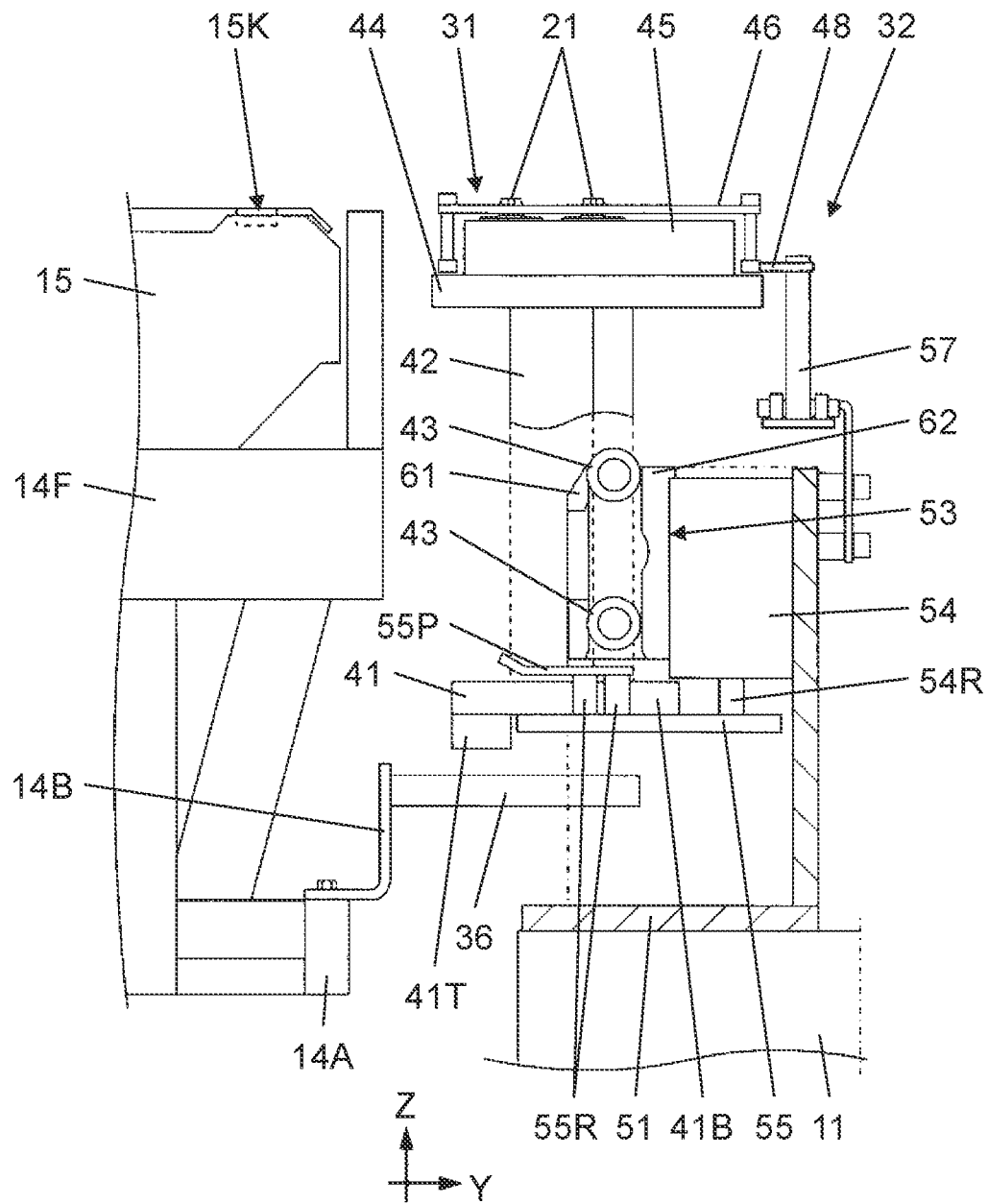
FIG. 18 is a side view illustrating the state of the process in which the nozzle replacement table is held by the replacement table holder of the component-mounting device according to the embodiment of the present disclosure.
Figure 19:
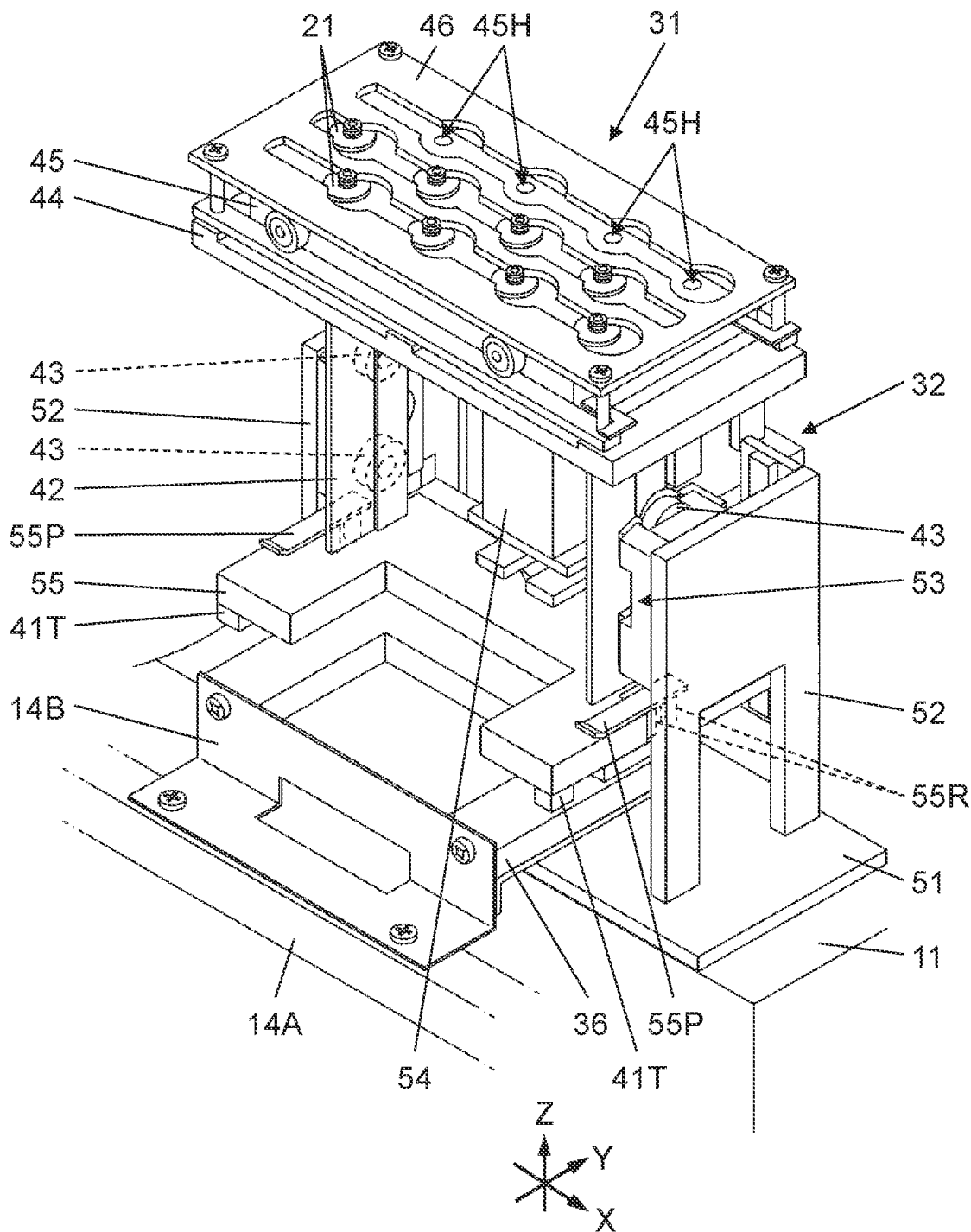
FIG. 19 is a perspective view illustrating the state in which the nozzle replacement table is held by the replacement table holder of the component-mounting device according to the embodiment of the present disclosure.
Figure 20A:
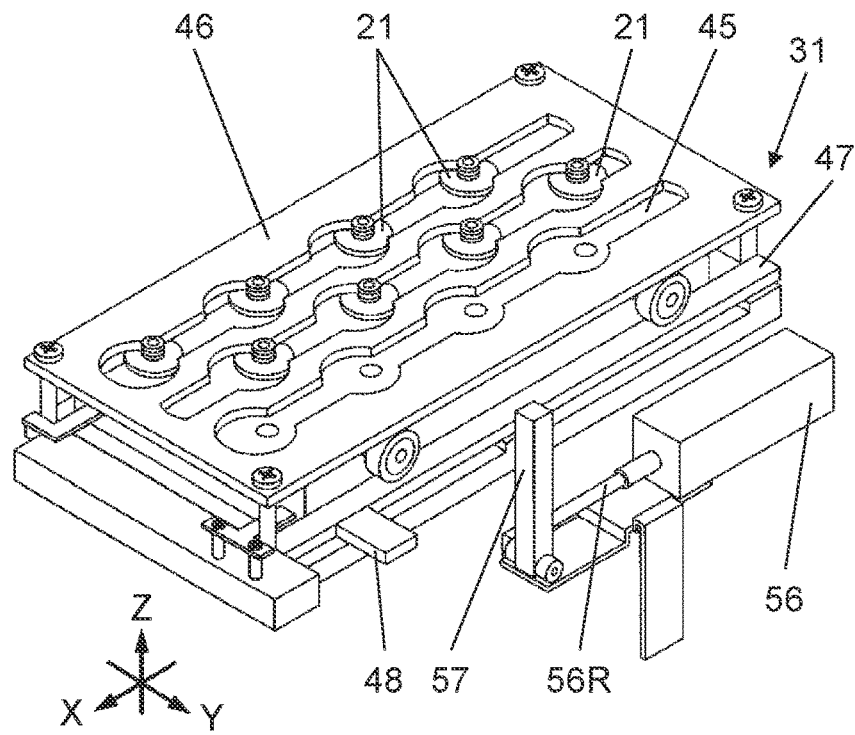
FIG. 20A is a perspective view explaining a positional relationship between a shutter operator and an operated piece before and after the nozzle replacement table is held by the replacement table holder of the component-mounting device according to the embodiment of the present disclosure.
Figure 20B:
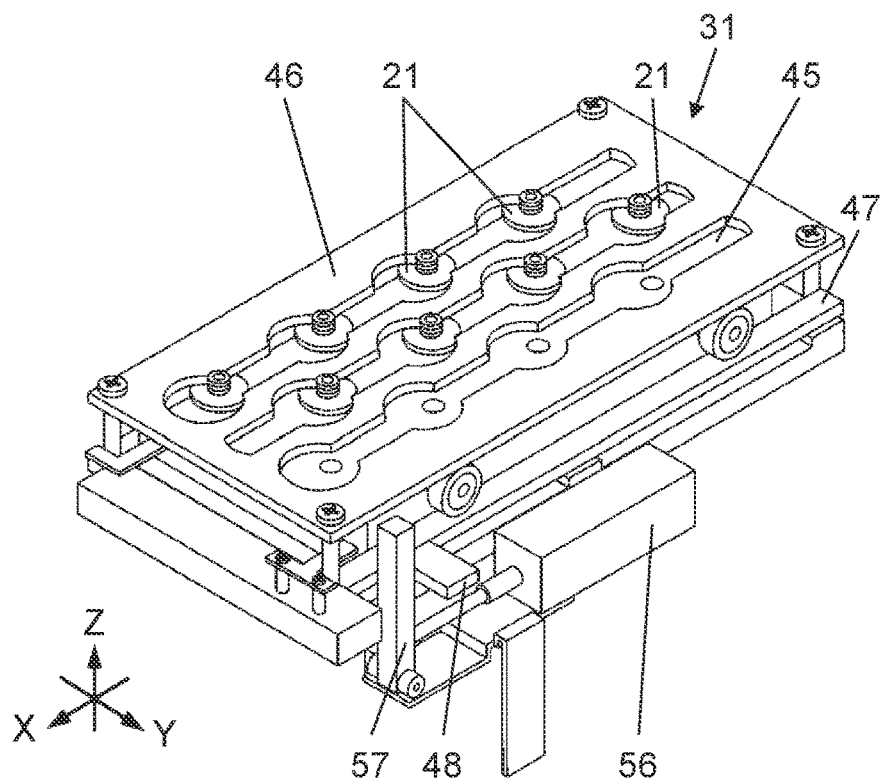
FIG. 20B is a perspective view illustrating the positional relationship between the shutter operator and the operated piece before and after the nozzle replacement table is held by the replacement table holder of the component-mounting device according to the embodiment of the present disclosure.

When nozzle replacement table 31 is raised by raising/lowering cylinder 54, four rollers 43 (right and left upper and lower rollers 43) of nozzle replacement table 31 are guided by guide grooves 63 of right and left roller guides 53 and move (are raised) straightly upward inside guide groove 63. Then, when nozzle replacement table 31 is located at the holding position, right and left upper and lower rollers 43 are interposed between front wall 61 and rear wall 62, respectively. Therefore, nozzle replacement table 31 is firmly held at the predetermined holding position by replacement table holder 32 (FIGS. 18 and 19).

As described above, component-mounting device 1 according to the present embodiment includes nozzle replacement table 31 which holds replacement nozzle 21 attached to or detached from mounting head 17, replacement table holder 32 which is provided in base 11 and holds nozzle replacement table 31 at the predetermined holding position within the movable range of mounting head 17, and placing table 36 which is provided in feeder carriage 14 and on which nozzle replacement table 31 before being held by replacement table holder 32 is placed. Then, when feeder carriage 14 is connected to base 11, replacement table holder 32 receives nozzle replacement table 31 from placing table 36 and raises nozzle replacement table 31, and holds nozzle replacement table 31 at the holding position in a state where nozzle replacement table 31 is separated from placing table 36.

Replacement table holder 32 includes raising/lowering cylinder 54 serving as a replacement table moving unit configured to vertically move nozzle replacement table 31 received from placing table 36, and right and left roller guides 53 serving as a guide member configured to guide nozzle replacement table 31 so that nozzle replacement table 31 raised by raising/lowering cylinder 54 is raised toward the holding position. When nozzle replacement table 31 is raised by raising/lowering cylinder 54, the four rollers included in nozzle replacement table 31 are guided by right and left roller guides 53. Accordingly, nozzle replacement table 31 is raised straightly upward and is held at the holding position.

Moreover, as described above, nozzle replacement table 31 moves diagonally upward toward the center portion side of base 11 with respect to replacement table holder 32 (FIG. 16→FIG. 17). Accordingly, operated piece 48 of nozzle replacement table 31 is located on a side of shutter operator 57 included in replacement table holder 32 (FIG. 16→FIG. 17 and FIG. 20A→FIG. 20B). Then, nozzle replacement table 31 is moved upward by raising/lowering cylinder 54. However, in this case, since nozzle replacement table 31 moves straight upward, a state where operated piece 48 is located on the side of shutter operator 57 is maintained. (FIG. 17→FIG. 18).

Figure 21A:
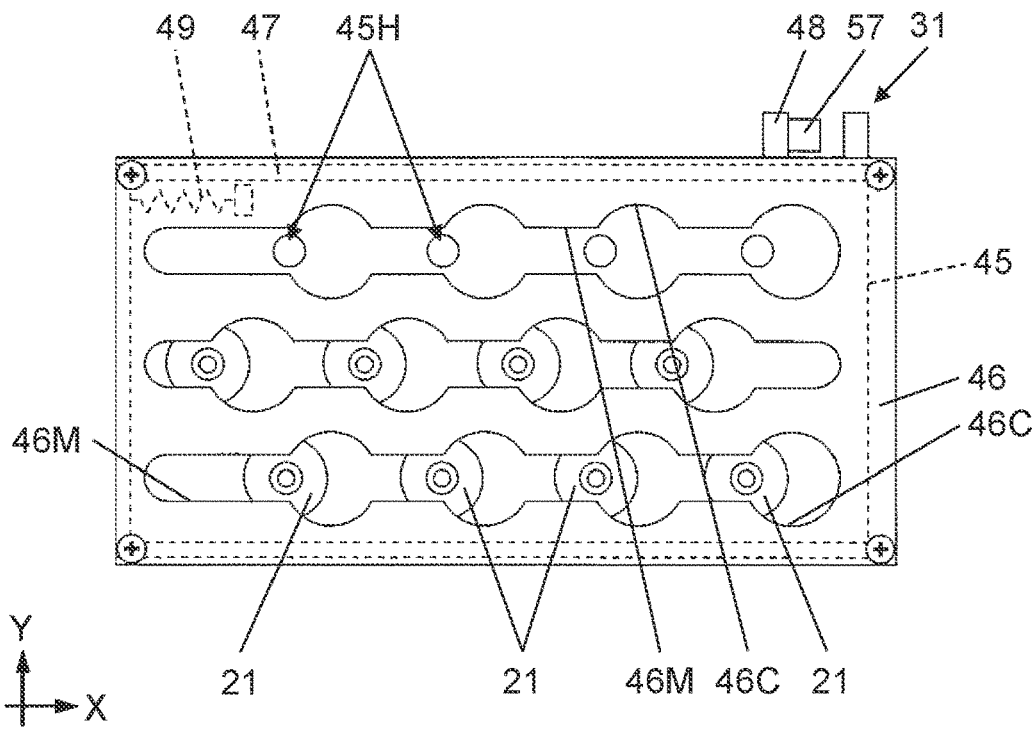
FIG. 21A is a plan view of the nozzle replacement table included in the component-mounting device according to the embodiment of the present disclosure.
Figure 21B:
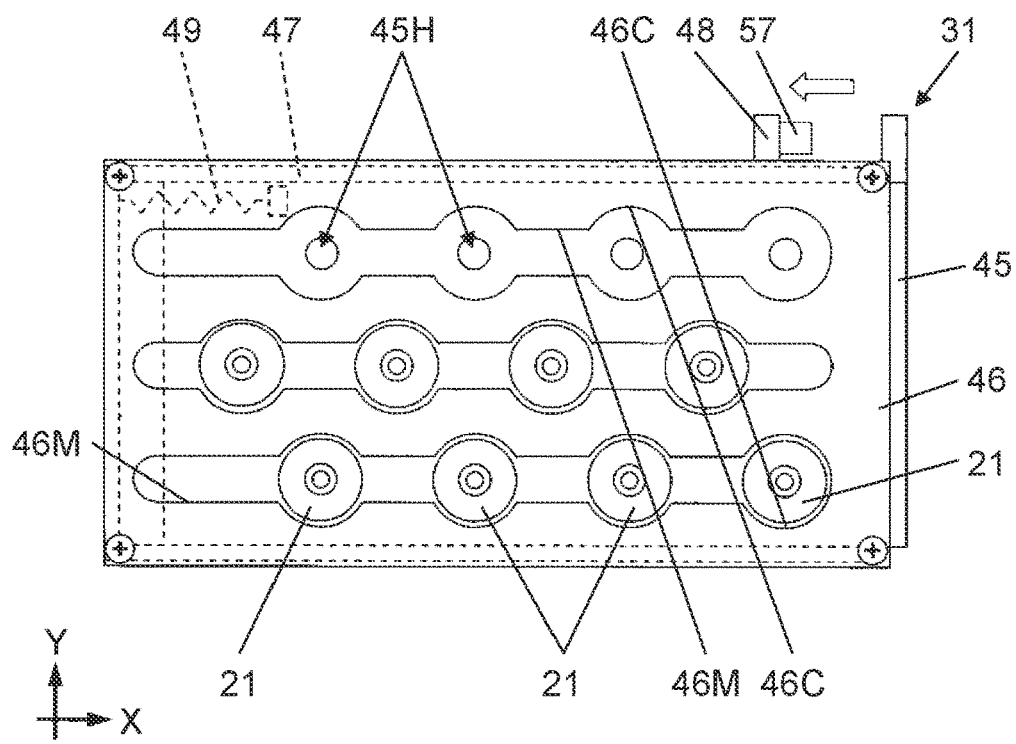
FIG. 21B is a plan view of the nozzle replacement table included in the component-mounting device according to the embodiment of the present disclosure.

As described above, in the state where nozzle replacement table 31 is held at the predetermined holding position by replacement table holder 32, operated piece 48 is located on the side of shutter operator 57. Accordingly, shutter operator 57 is moved in the X-axis direction by shutter operating cylinder 56, and thus, shutter 46 can be switched from the closed position to the open position (FIG. 21A→FIG. 21B). When shutter operating cylinder 56 returns shutter operator 57 to an original position after switching shutter 46 to the open position, shutter 46 is returned to the closed position by the biasing force of biasing member 49 (FIG. 21B→FIG. 21A).

As described above, in the present embodiment, shutter operator 57 serving as a movable portion operating unit for operating shutter 46, which is a movable portion of nozzle replacement table 31, and shutter operating cylinder 56 serving as an actuator for driving shutter operator 57 are included in replacement table holder 32. In a state where nozzle replacement table 31 is held at the holding position by replacement table holder 32, shutter operator 57 is located at a position where shutter 46 of nozzle replacement table 31 can be operated.

In FIG. 9, placing table 36 includes placement state detection sensor 71. Placement state detection sensor 71 detects a state in which nozzle replacement table 31 is placed on placing table 36 and outputs a detection signal to controller 20. Controller 20 detects the state in which nozzle replacement table 31 is placed on placing table 36 based on the output of placement state detection sensor 71.

In FIG. 12, replacement table holder 32 includes holding state detection sensor 72. Holding state detection sensor 72 detects the state in which nozzle replacement table 31 is held at the holding position based on an amount of downward protrusion of the piston rod (raising/lowering rod 54R) of raising/lowering cylinder 54 and a magnitude of a load, and outputs a detection signal to controller 20. Controller 20 detects the state in which nozzle replacement table 31 is held at the holding position based on the output of holding state detection sensor 72.

Figure 22A:
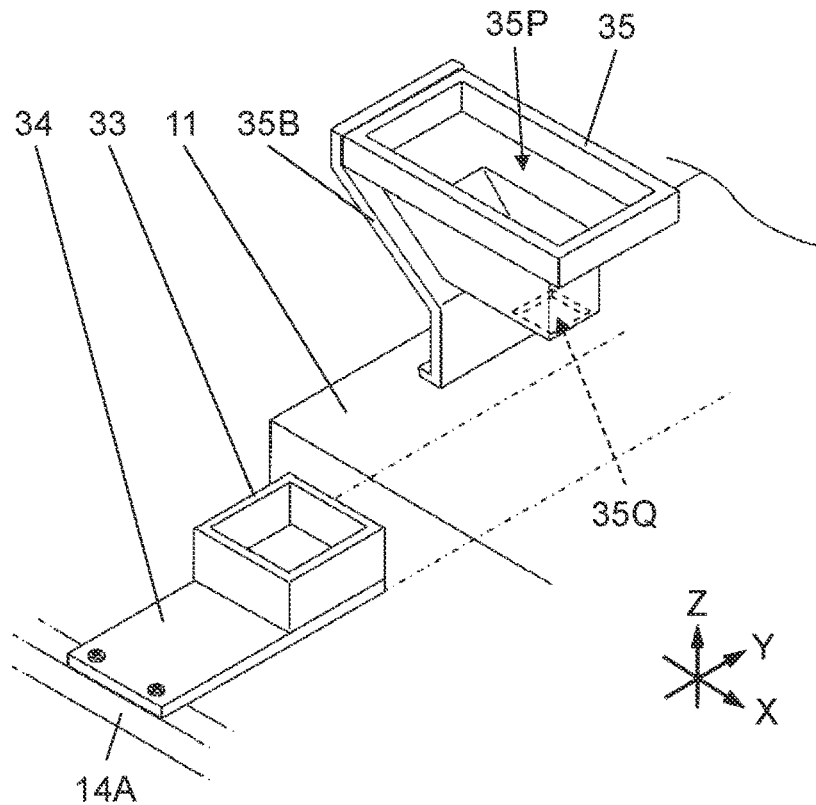
FIG. 22A is a perspective view explaining a manner in which a component discard box of the component-mounting device according to the embodiment of the present disclosure is installed within a movable range of the mounting head.
Figure 22B:
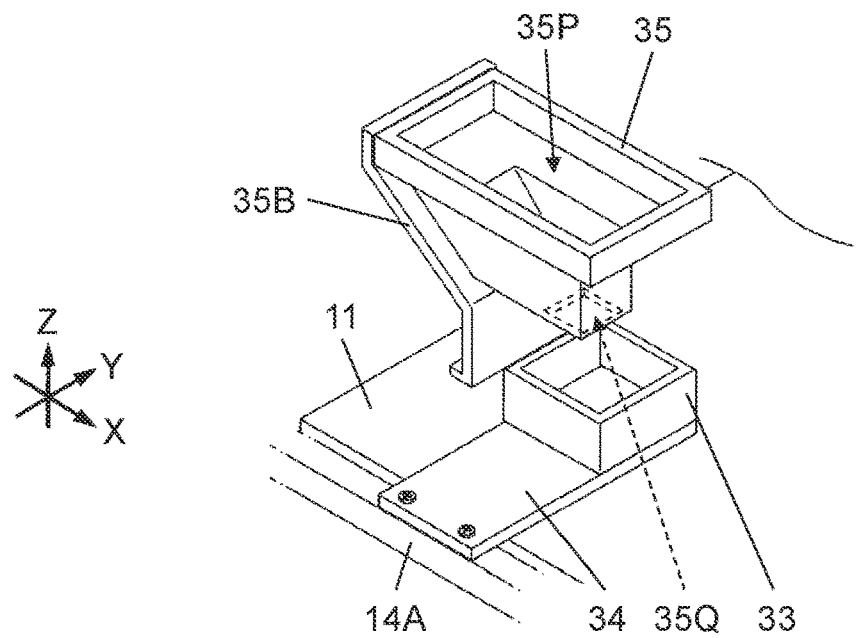
FIG. 22B is a perspective view explaining a manner in which the component discard box of the component-mounting device according to the embodiment of the present disclosure is installed within the movable range of the mounting head.

As described above, when feeder carriage 14 is pushed into base 11, component discard box 33 attached to feeder carriage 14 enters the equipment installation region of base 11 and is located below discharge port 35Q of shooter 35. (FIG. 22A→FIG. 22B). Therefore, operator OP can install component discard box 33 within the movable range of mounting head 17 by connecting feeder carriage 14 to base 11 without opening door 12C of base cover 12.

The replacement operation of nozzle 21 is executed in a state where nozzle replacement table 31 is held at the holding position by replacement table holder 32. To replace nozzle 21, nozzle 21 attached to nozzle shaft 17S is held by nozzle replacement table 31 and is removed from nozzle shaft 17S, and then replacement nozzle 21 held by nozzle replacement table 31 is attached to nozzle shaft 17S. In this case, when there are plurality of nozzles 21 to be replaced, the replacement operations for plurality of nozzles 21 are collectively executed.

In the nozzle replacement operation, in a case where nozzle 21 is removed from nozzle shaft 17S, first, shutter operating cylinder 56 is operated to locate shutter 46 from the closed position to the open position (FIG. 21A→FIG. 21B). Then, mounting head 17 is moved so that a vertical center axis of nozzle 21 coincides with a vertical center axis of nozzle insertion hole 45H of nozzle replacement table 31. When the vertical center axis of nozzle 21 and the vertical center axis of nozzle insertion hole 45H coincide with each other, mounting head 17 lowers nozzle shaft 17S so that nozzle 21 attached to nozzle shaft 17S is inserted into empty nozzle insertion hole 45H.

When nozzle 21 is inserted into nozzle insertion hole 45H, shutter operating cylinder 56 is operated so that shutter 46 is moved from the open position to the closed position (FIG. 21B→FIG. 21A). When mounting head 17 pulls nozzle shaft 17S upward in the state where shutter 46 is located at the closed position, flange portion 24 of nozzle 21 interferes with shutter 46 and is prevented from moving upward. Accordingly, nozzle 21 is extracted from nozzle shaft 17S and nozzle 21 remains on nozzle replacement table 31. Therefore, nozzle 21 is removed from nozzle shaft 17S.

In a case where replacement nozzle 21 is attached to nozzle shaft 17S from which nozzle 21 has been removed in this way, first, mounting head 17 moves, and nozzle shaft 17S to which nozzle 21 is attached is positioned above replacement nozzle 21 held by nozzle replacement table 31. Then, the vertical center axis of nozzle shaft 17S coincides with the vertical center axis of nozzle 21, and nozzle shaft 17S is lowered. Accordingly, base portion 22 of replacement nozzle 21 is coupled (externally fitted) to the lower end of nozzle shaft 17S.

When base portion 22 of nozzle 21 is coupled to the lower end of nozzle shaft 17S, shutter operating cylinder 56 is operated to move shutter 46 from the closed position to the open position (FIG. 21A→FIG. 21B). When shutter 46 is located at the open position, mounting head 17 pulls nozzle shaft 17S upward. Therefore, nozzle 21 is pulled up in a state of being coupled to the lower end of nozzle shaft 17S, and replacement nozzle 21 is attached to nozzle shaft 17S. Accordingly, the replacement operation of nozzle 21 is completed.

In a case where nozzle replacement table 31 held at the holding position by replacement table holder 32 is removed by the operation of separating feeder carriage 14 from base 11, raising/lowering cylinder 54 lowers raising/lowering plate 55 before feeder carriage 14 is separated from base 11. Accordingly, nozzle replacement table 31 raised by raising/lowering plate 55 moves along a route opposite to the case where nozzle replacement table 31 is held at the holding position, and is placed on placing table 36 provided in feeder carriage 14. In this case, four rollers 43 of nozzle replacement table 31 move straightly downward through guide grooves 63 of two roller guides 53 included in replacement table holder 32 (FIG. 18→FIG. 17).

After nozzle replacement table 31 is placed on placing table 36 as described above, when feeder carriage 14 is separated from base 11, in the state where nozzle replacement table 31 is placed on placing table 36, nozzle replacement table 31 moves diagonally downward in the direction away from the center portion of base 11 and is separated from raising/lowering plate 55 (FIG. 17→FIG. 16). Thereafter, in the state where nozzle replacement table 31 is placed on placing table 36, nozzle replacement table 31 moves together with feeder carriage 14, and is separated from base 11 (FIG. 16→FIG. 15). In this way, replacement table holder 32 lowers nozzle replacement table 31 from the holding position and places nozzle replacement table 31 on placing table 36.

As described above, when feeder carriage 14 is separated from base 11, component discard box 33 attached to feeder carriage 14 is evacuated to an outside of the equipment installation region of base 11 (FIG. 22B→FIG. 22A). Therefore, in the present embodiment, component discard box 33 can be removed from the movable range of mounting head 17 by separating feeder carriage 14 from base 11.

As the production of the board by component-mounting device 1 proceeds, nozzle 21 of a type not held by nozzle replacement table 31 is required to be supplied to the component-mounting device. In this case, operator OP performs the replacement operation of nozzle replacement table 31. As the production of the board proceed, it becomes necessary to replace component discard box 33 in order to collect the discarded components accumulated in component discard box 33 until then.

In a situation in which the component mounting operation is stopped on the side where nozzle replacement table 31 or component discard box 33 to be replaced is installed, replacement operation of nozzle replacement table 31 or component discard box 33 can be performed by operator OP inserting his/her hand into working space 11S in a state where door 12C on the side is open. However, in this case, since the safety device is operated by opening door 12C, while nozzle replacement table 31 or component discard box 33 is replaced, a component mounting operation on a side opposite to the side on which the operation is performed is also forcibly stopped.

In the present embodiment, as described above, by connecting feeder carriage 14 to base 11, nozzle replacement table 31 and component discard box 33 can be installed within the equipment installation region (that is, the movable range of mounting head 17) of base 11. Moreover, by separating feeder carriage 14 from base 11, nozzle replacement table 31 and component discard box 33 can be removed from the equipment installation region of base 11. Therefore, the replacement of nozzle replacement table 31 and the replacement of component discard box 33 can be performed without opening door 12C. In this case, since operator OP does not need to open door 12C of base cover 12, the safety device does not operate, and even when nozzle replacement table 31 or component discard box 33 is replaced on one of the front side and the rear side, the component mounting operation is continued on the other side. Accordingly, the operation of component-mounting device 1 as a whole is maintained.

Therefore, in component-mounting device 1 according to the present embodiment, the replacement operation of nozzle replacement table 31 and the replacement operation (that is, the collection operation of the discarded components) of component discard box 33 can be easily performed without opening door 12C of base cover 12. Further, since door 12C cannot be opened, the safety device is not operated to forcibly stop the component mounting operation, and the replacement operation of nozzle replacement table 31 and the replacement operation of component discard box 33 can be efficiently performed. Next, a flow of operation of each portion of component-mounting device 1 in the replacement operation of nozzle replacement table 31 by feeder carriage 14 will be described.

Figure 23:
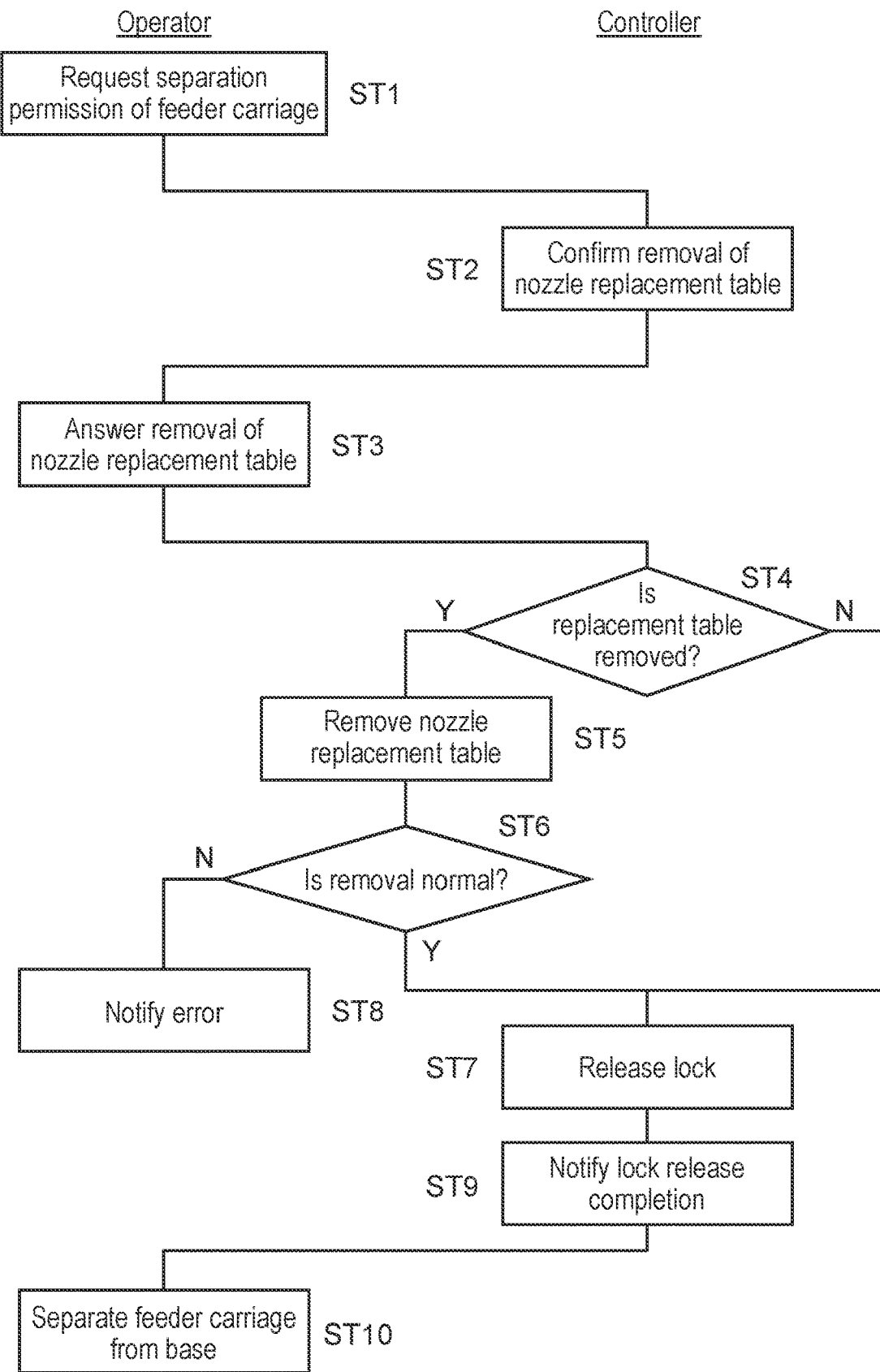
FIG. 23 is a flowchart illustrating an example of a flow of an operation of the component-mounting device according to the embodiment of the present disclosure.

FIG. 23 illustrates a flow of operations of component-mounting device 1 in a case where feeder carriage 14 connected to base 11 is separated from base 11 in the replacement operation of nozzle replacement table 31. In the case where feeder carriage 14 connected to base 11 is separated from base 11, first, operator OP performs an input operation requesting permission (separation permission) to separate feeder carriage 14 from touch panel TP (Step ST1 in the flowchart of FIG. 23). The operation of requesting the separation permission is performed from touch panel TP on a side where operator OP tries to separate feeder carriage 14. More specifically, in a case where front-side feeder carriage 14 of base 11 is to be separated from base 11, the operation for requesting the separation permission is performed on front-side touch panel TP, and in a case where rear-side feeder carriage 14 of base 11 is to be separated from base 11, the operation for requesting the separation permission is performed on rear-side touch panel TP.

In a case where controller 20 detects from touch panel TP that the operation of requesting the separation permission has been performed, when feeder carriage 14 is separated from base 11, controller 20 notifies operator OP to confirm whether or not nozzle replacement table 31 held by replacement table holder 32 is also removed (Step ST2). This notification is performed by displaying a message inquiring whether or not to remove nozzle replacement table 31 on a screen of touch panel TP. Then, when operator OP inputs an answer to the notification on touch panel TP (Step ST3), controller 20 confirms a content of the answer input by operator OP in Step ST3 (Step ST4). Then, in a case where the input answer is to remove nozzle replacement table 31, controller 20 operates raising/lowering cylinder 54 of replacement table holder 32 to lower nozzle replacement table 31 and places nozzle replacement table 31 on placing table 36. Accordingly, nozzle replacement table 31 is removed from replacement table holder 32 (Step ST5).

When nozzle replacement table 31 is removed from replacement table holder 32, controller 20 determines whether or not nozzle replacement table 31 has been normally removed based on the output from placement state detection sensor 71 (Step ST6). Specifically, in a case where it is detected that nozzle replacement table 31 is placed on placing table 36 within a predetermined time after the operation of raising/lowering cylinder 54 is started, controller 20 determines that nozzle replacement table 31 is normally removed. Meanwhile, in a case where it is not detected that nozzle replacement table 31 is placed on placing table 36 even after a lapse of a predetermined time, controller 20 determines that nozzle replacement table 31 is not normally removed.

In the case where controller 20 determines that nozzle replacement table 31 has been normally removed, controller 20 causes carriage locker 11R to perform an operation of releasing the lock of feeder carriage 14 (Step ST7). Meanwhile, in the case where controller 20 determines that nozzle replacement table 31 has not been removed normally, controller 20 does not cause carriage locker 11R to release the lock of feeder carriage 14, and notifies operator OP of an error through touch panel TP (Step ST8). In a case where controller 20 confirms in Step ST4 that the answer input by operator OP is not to remove nozzle replacement table 31, controller 20 does not remove nozzle replacement table 31 from replacement table holder 32 and causes carriage locker 11R to release the lock of feeder carriage 14 (Step ST7).

When the release of the lock of feeder carriage 14 by carriage locker 11R is completed, controller 20 notifies operator OP via touch panel TP that the release of the lock of feeder carriage 14 is completed (Step ST9). When operator OP receives, through touch panel TP, the notification indicating that the lock of feeder carriage 14 is released, operator OP operates feeder carriage 14 to separate feeder carriage 14 from base 11 (Step ST10). Accordingly, the operation of separating feeder carriage 14 from base 11 is completed.

As described above, in component-mounting device 1 according to the present embodiment, in a case where the requesting of the permission to separate feeder carriage 14 from base 11 is input from touch panel TP serving as the input unit, controller 20 inquires of operator OP whether or not to remove nozzle replacement table 31 held by replacement table holder 32 from replacement table holder 32. When the answer from operator OP is that nozzle replacement table 31 is to be removed, nozzle replacement table 31 is removed from replacement table holder 32 and placed on placing table 36, and then carriage locker 11R releases the lock of feeder carriage 14. In addition, when the answer is that nozzle replacement table 31 is not removed from replacement table holder 32, nozzle replacement table 31 is not removed from replacement table holder 32 and carriage locker 11R releases the lock of feeder carriage 14.

In the above example, when feeder carriage 14 is separated from base 11, nozzle replacement table 31 held by replacement table holder 32 can be removed together. Accordingly, even when door 12C of base cover 12 is not opened, the replacement operation of nozzle replacement table 31 can be easily performed. As described above, operator OP opens door 12C and inserts his/her hand into working space 11S when the component mounting operation of component-mounting device 1 is not performed at all, and operator OP can manually perform the replacement operation of nozzle replacement table 31 with respect to replacement table holder 32. In this case, when nozzle replacement table 31 held by replacement table holder 32 is manually removed, nozzle replacement table 31 located at the holding position may be pulled out upward as it is, and when nozzle replacement table 31 is attached, the attachment may be performed in the reverse order of the removal.

Figure 24:
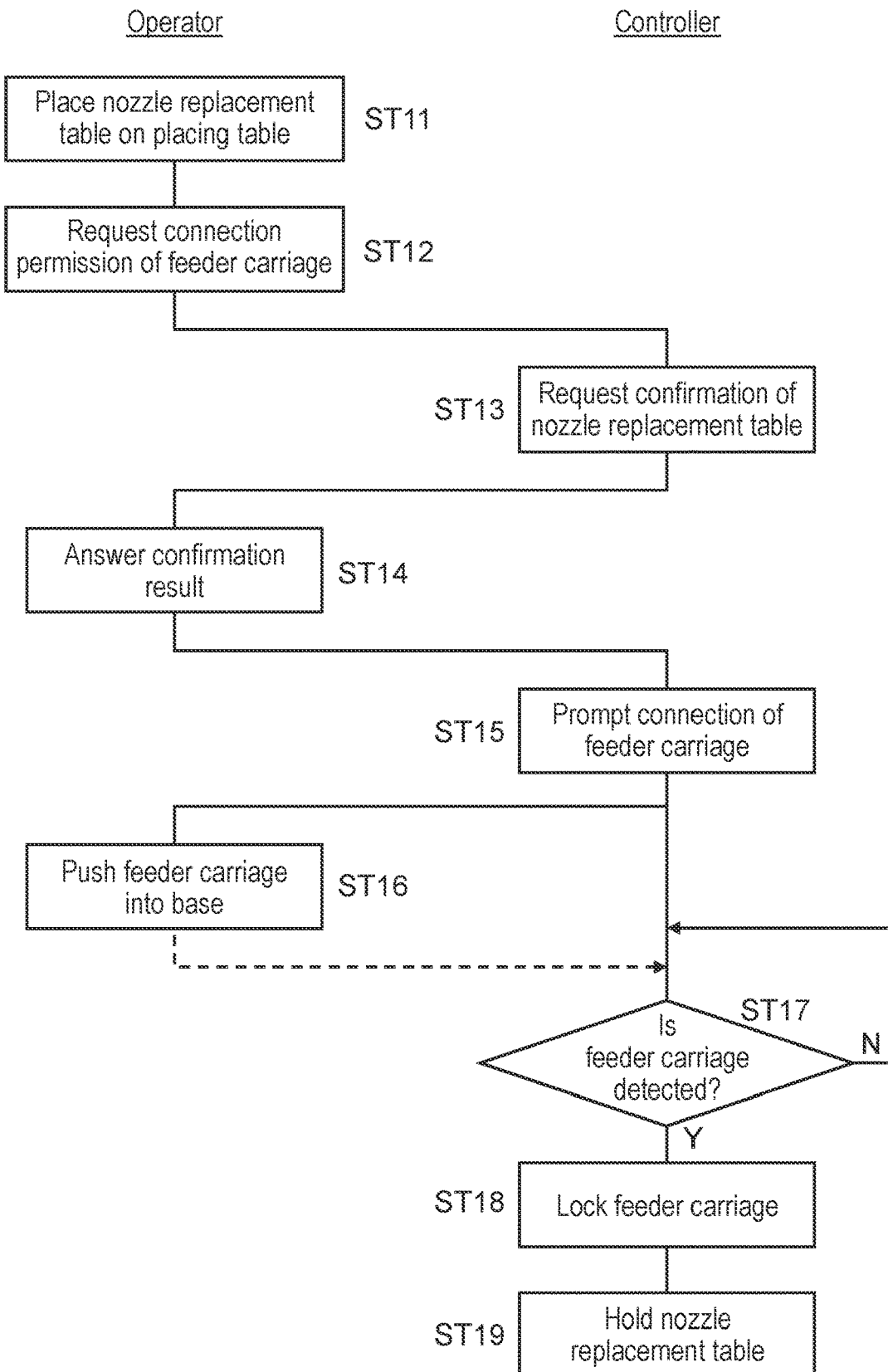
FIG. 24 is a flowchart illustrating an example of the flow of the operation of the component-mounting device according to the embodiment of the present disclosure.

FIG. 24 illustrates a flow of operations of component-mounting device 1 in the case where nozzle replacement table 31 is installed on base 11 by connecting feeder carriage 14 to base 11 in the replacement operation of nozzle replacement table 31. In the case where nozzle replacement table 31 is installed on base 11 by connecting feeder carriage 14 to base 11, first, operator OP places nozzle replacement table 31 on placing table 36 (Step ST11 in the flowchart of FIG. 24). Then, operator OP performs an input operation of requesting permission (connection permission) to connect feeder carriage 14 to base 11 on touch panel TP (Step ST12). The operation of requesting the connection permission is performed from touch panel TP on a side where operator OP tries to connect feeder carriage 14. More specifically, in a case where feeder carriage 14 is to be connected to the front side of base 11, the operation for requesting the connection permission is performed on front-side touch panel TP, and in a case where feeder carriage 14 is to be connected to the rear side of base 11, the operation for requesting the connection permission is performed on rear-side touch panel TP.

In a case where controller 20 detects that there is the operation for requesting the connection permission from front-side or rear-side touch panel TP, controller 20 requests operator OP through touch panel TP to confirm whether or not replacement table holder 32 on the side to which feeder carriage 14 is to be connected is free (Step ST13). This request is performed by displaying a message which calls operator OP's attention on the screen of touch panel TP. Accordingly, operator OP does not perform an erroneous operation in which feeder carriage 14 with nozzle replacement table 31 is connected in a state where nozzle replacement table 31 which is not removed from replacement table holder 32 is placed. Then, after operator OP visually confirms the state where nozzle replacement table 31 is not placed on replacement table holder 32, when operator OP performs an answer to the intent on touch panel TP (Step ST14), controller 20 prompts operator OP through touch panel TP to connect feeder carriage 14 to base 11 (Step ST15).

When operator OP is prompted to connect feeder carriage 14 to base 11, operator OP pushes feeder carriage 14 into base 11 (Step ST16). After controller 20 prompts operator OP to connect feeder carriage 14 to base 11 in Step ST15, controller 20 monitors whether or not feeder carriage 14 reaches a position at which feeder carriage 14 can be connected to base 11 based on the output of carriage detection sensor 11M (Step ST17). Then, in a case where controller 20 detects that feeder carriage 14 reaches the position at which feeder carriage 14 can be connected, after controller 20 locks carriage locker 11R to feeder carriage 14 and connects feeder carriage 14 to base 11 (Step ST18), controller 20 operates raising/lowering cylinder 54 of replacement table holder 32 to hold nozzle replacement table 31 by replacement table holder 32 (Step ST19). Accordingly, the installation of nozzle replacement table 31 on base 11 is completed.

Figure 25:
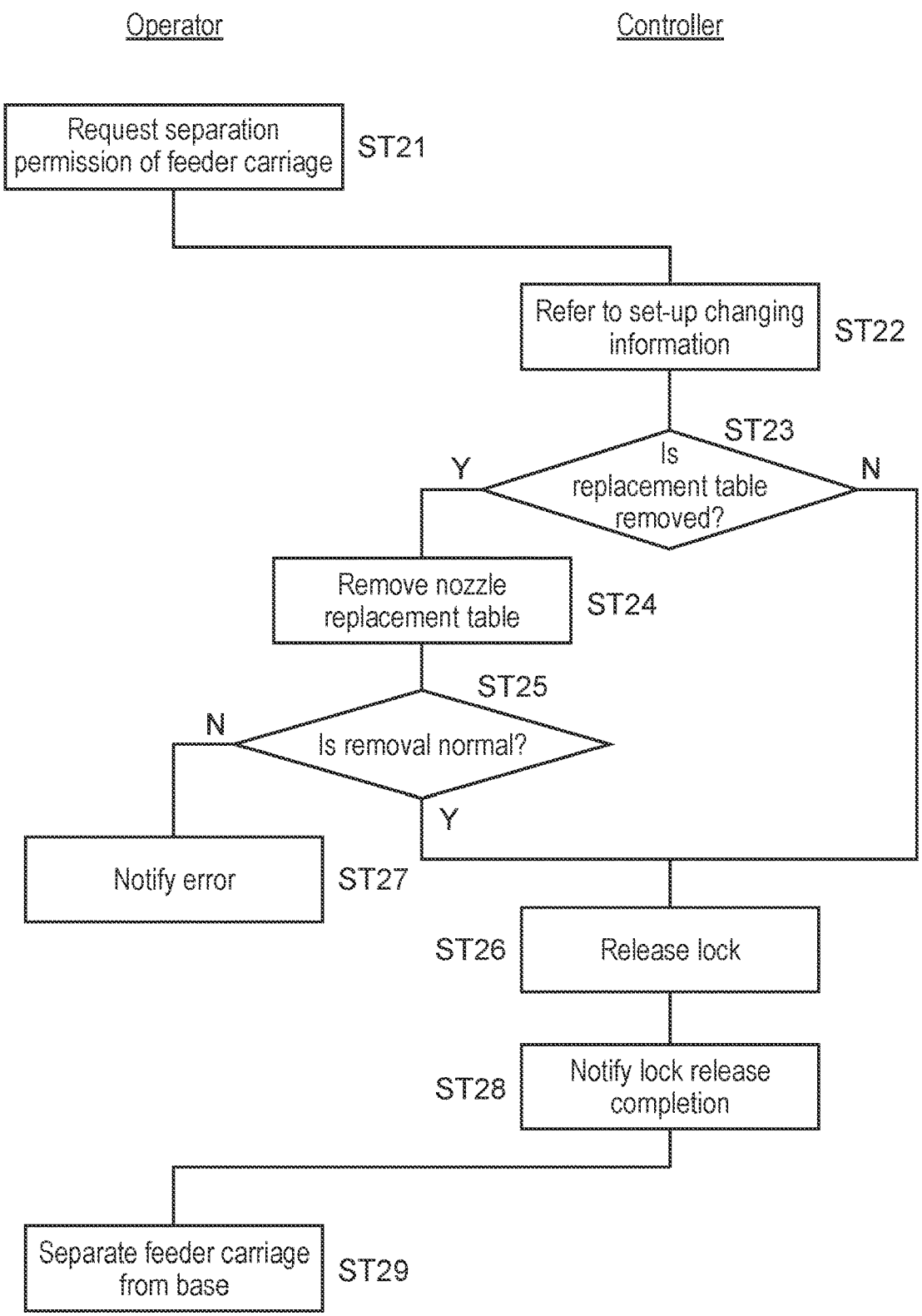
FIG. 25 is a flowchart illustrating an example of a flow of an operation of a component-mounting device in a modification example of the embodiment of the present disclosure.

In the operation illustrated in the flowchart of FIG. 23, operator OP determines whether or not to remove nozzle replacement table 31 together with feeder carriage 14. However, component-mounting device 1 may perform the determination. FIG. 25 is a flowchart illustrating a modification example.

First, operator OP performs the input operation requesting permission (separation permission) to separate feeder carriage 14 from touch panel TP (Step ST21). The operation of requesting the separation permission is performed from touch panel TP on a side where operator OP tries to separate feeder carriage 14. In a case where controller 20 detects from touch panel TP that there is the operation of requesting the separation permission, controller 20 refers to set-up changing information stored in a storage unit of controller 20 or a server device capable of communicating with controller 20. (Step ST22).

This set-up changing information is prepared in advance based on a production plan. Then, when it is confirmed from the set-up changing information that nozzle replacement table 31 is removed together with feeder carriage 14 for which the separation permission is requested (Step ST23), controller 20 operates raising/lowering cylinder 54 of replacement table holder 32 to lower nozzle replacement table 31 and places nozzle replacement table 31 on placing table 36. Accordingly, nozzle replacement table 31 is removed from replacement table holder 32 (Step ST24). Then, when it is confirmed that nozzle replacement table 31 is normally removed (Step ST25), carriage locker 11R releases the lock (Step ST26). When controller 20 confirms that nozzle replacement table 31 is not removed (Step ST23), controller 20 skips steps ST24 and ST25 so that carriage locker 11R releases the lock (Step ST26). In a case where controller 20 determines that nozzle replacement table 31 is not normally removed, controller 20 does not cause carriage locker 11R to release the lock of feeder carriage 14, and notifies operator OP of an error through touch panel TP (Step ST27).

When the release of the lock of feeder carriage 14 by carriage locker 11R is completed, controller 20 notifies operator OP via touch panel TP that the release of the lock of feeder carriage 14 is completed (Step ST28). When operator OP receives, through touch panel TP, the notification indicating that the lock of feeder carriage 14 is released, operator OP operates feeder carriage 14 to separate feeder carriage 14 from base 11 (Step ST29). As described above, in the modification example, component-mounting device 1 determines whether or not to remove nozzle replacement table 31 on the basis of the information (set-up changing information) based on the production plan. Accordingly, it is possible to prevent a determination error and a confirmation error of operator OP in advance.

Figure 26:
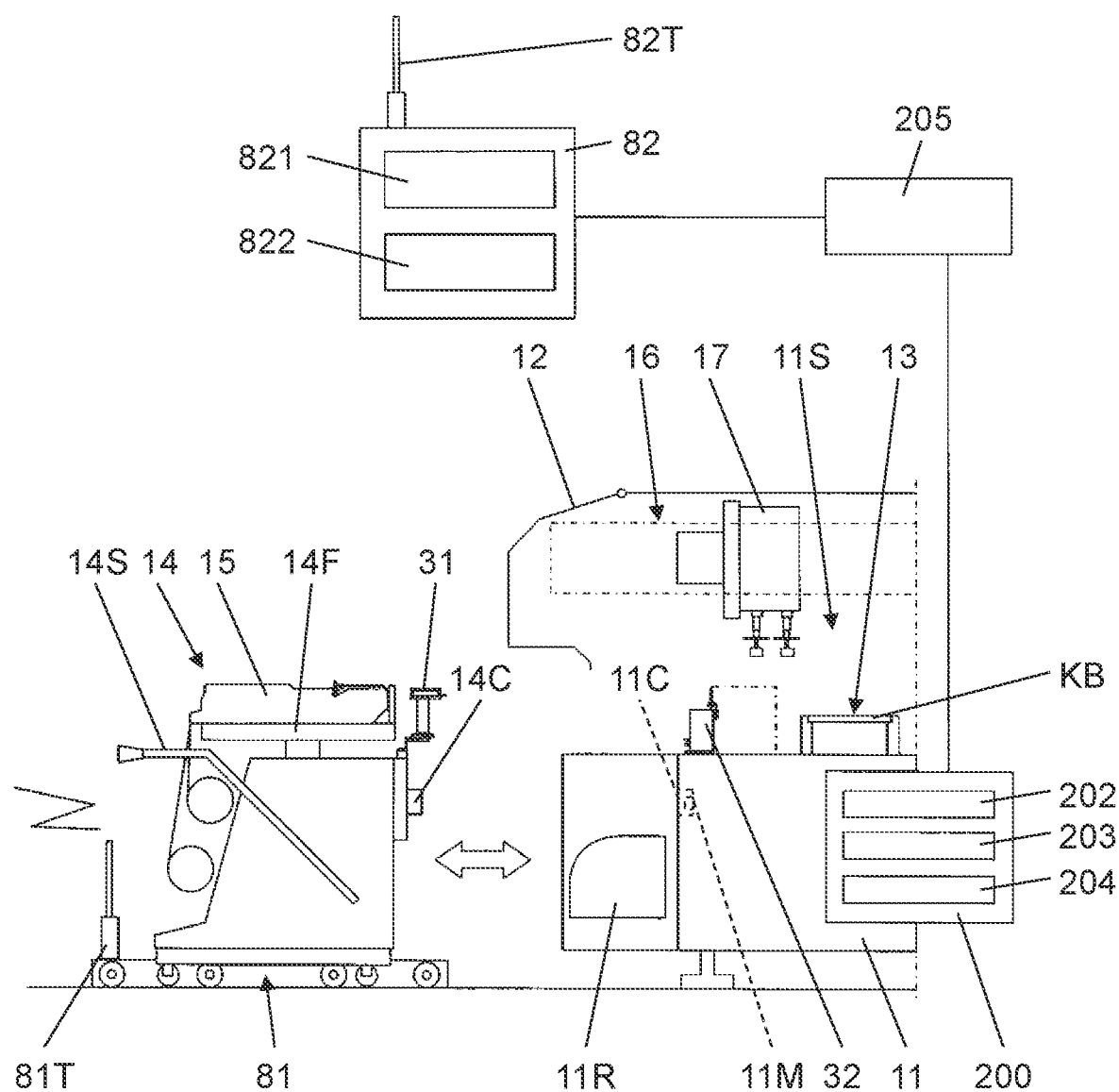
FIG. 26 is a view illustrating a configuration example of a work system including the component-mounting device according to the embodiment of the present disclosure.
Figure 29:
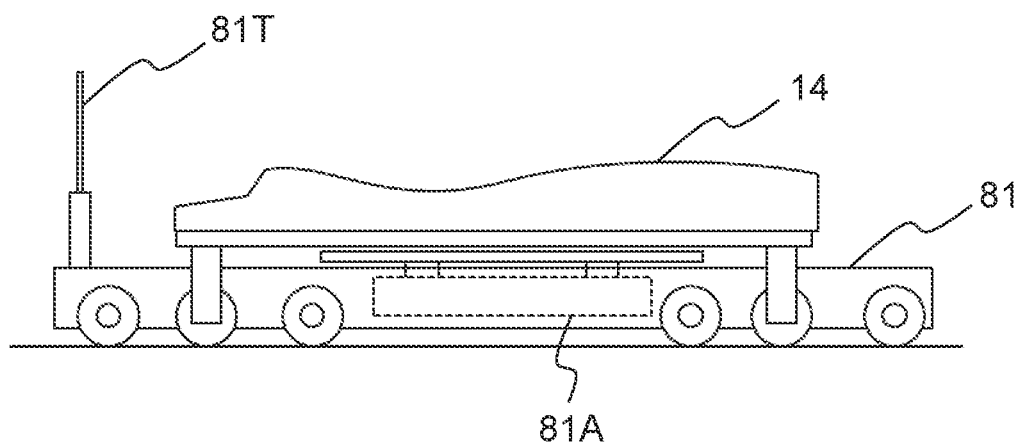
FIG. 29 is a view for explaining a capturing mechanism of an unmanned conveyance vehicle according to the embodiment of the present disclosure.
Figure 30:
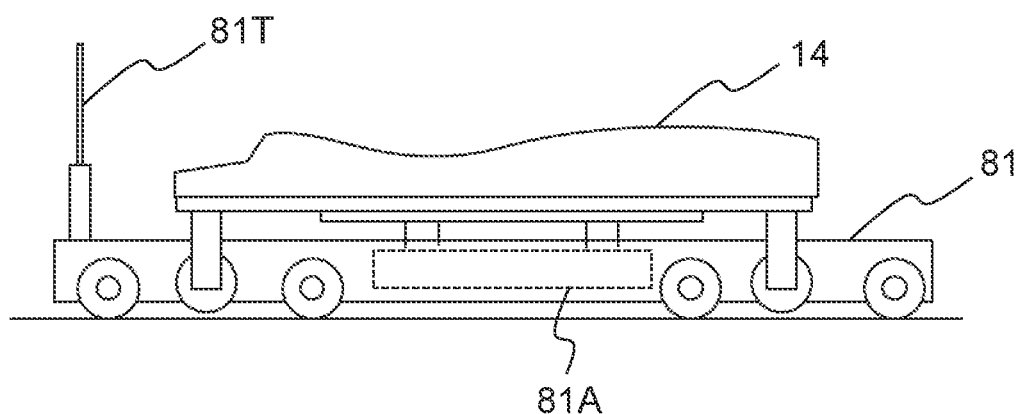
FIG. 30 is a view illustrating a state where the feeder carriage is raised by the capturing mechanism according to the embodiment of the present disclosure.

FIG. 26 illustrates a configuration example of work system 83 combining a mounting system including component-mounting device 1, self-propelled unmanned conveyance vehicle 81, and an unmanned conveyance system having management device 82 which guides unmanned conveyance vehicle 81 so that unmanned conveyance vehicle 81 travels on a floor surface. Unmanned conveyance vehicle 81 includes wireless communication device 81T, and management device 82 wirelessly transmits and receives a signal to and from unmanned conveyance vehicle 81 through wireless communication device 81T. Unmanned conveyance vehicle 81 includes capturing mechanism 81A (refer to FIG. 29) which raises and captures feeder carriage 14. Unmanned conveyance vehicle 81 travels by being guided wirelessly by management device 82, enters below feeder carriage 14, and then captures feeder carriage 14 by capturing mechanism 81A and transfers feeder carriage 14 in a state where feeder carriage 14 floats from the floor surface (refer to FIG. 30). In this work system 83, management device 82 causes unmanned conveyance vehicle 81 to travel so that unmanned conveyance vehicle 81 transfers feeder carriage 14. Accordingly, feeder carriage 14 can be connected to or separated from base 11. Capturing mechanism 81A is not limited to raising feeder carriage 14, and may be engaged with feeder carriage 14 in a pullable state.

The mounting system includes at least component-mounting device 1 and information management unit 205 connected to controller 200 of component-mounting device 1. Information management unit 205 functions as a higher-level control unit of component-mounting device 1, downloads data, a program, or the like required for driving of component-mounting device 1 to component-mounting device 1, and receives information, log information, or the like indicating the state of component-mounting device 1. Management device 82, information management unit 205, and controller 200 are connected to each other by a wired or wireless communication network, and the unmanned conveyance system and the mounting system transfer feeder carriage 14 while communicating with each other through the communication network.

Management device 82 includes first notifier 821 which notifies the mounting system of an arrival notification indicating that unmanned conveyance vehicle 81 arrives at a position where unmanned conveyance vehicle 81 can transfer feeder carriage 14, and first processor 822 which moves unmanned conveyance vehicle 81 in a direction away from base 11 to separate feeder carriage 14 from component-mounting device 1 when first processor 822 receives, from mounting system, a release notification indicating that the lock of feeder carriage 14 is released by carriage locker 11R.

Controller 200 has a function of controlling component-mounting device 1, and also has second notifier 202 and second processor 203. When second processor 203 receives the arrival notification from the unmanned conveyance system, second processor 203 performs a delivery operation of delivering nozzle replacement table 31 from replacement table holder 32 to placing table 36 and a release operation of causing carriage locker 11R to release the lock of feeder carriage 14. Second notifier 202 notifies the unmanned conveyance system of the release notification upon being informed that the release operation by carriage locker 11R is normally performed.

Controller 200 has determiner 204 which determines whether or not to remove nozzle replacement table 31 held by replacement table holder 32. Determiner 204 determines whether or not to remove nozzle replacement table 31 by referring to the set-up changing information stored in controller 200 or information management unit 205. This set-up changing information is prepared in advance based on a production plan.

Figure 27:
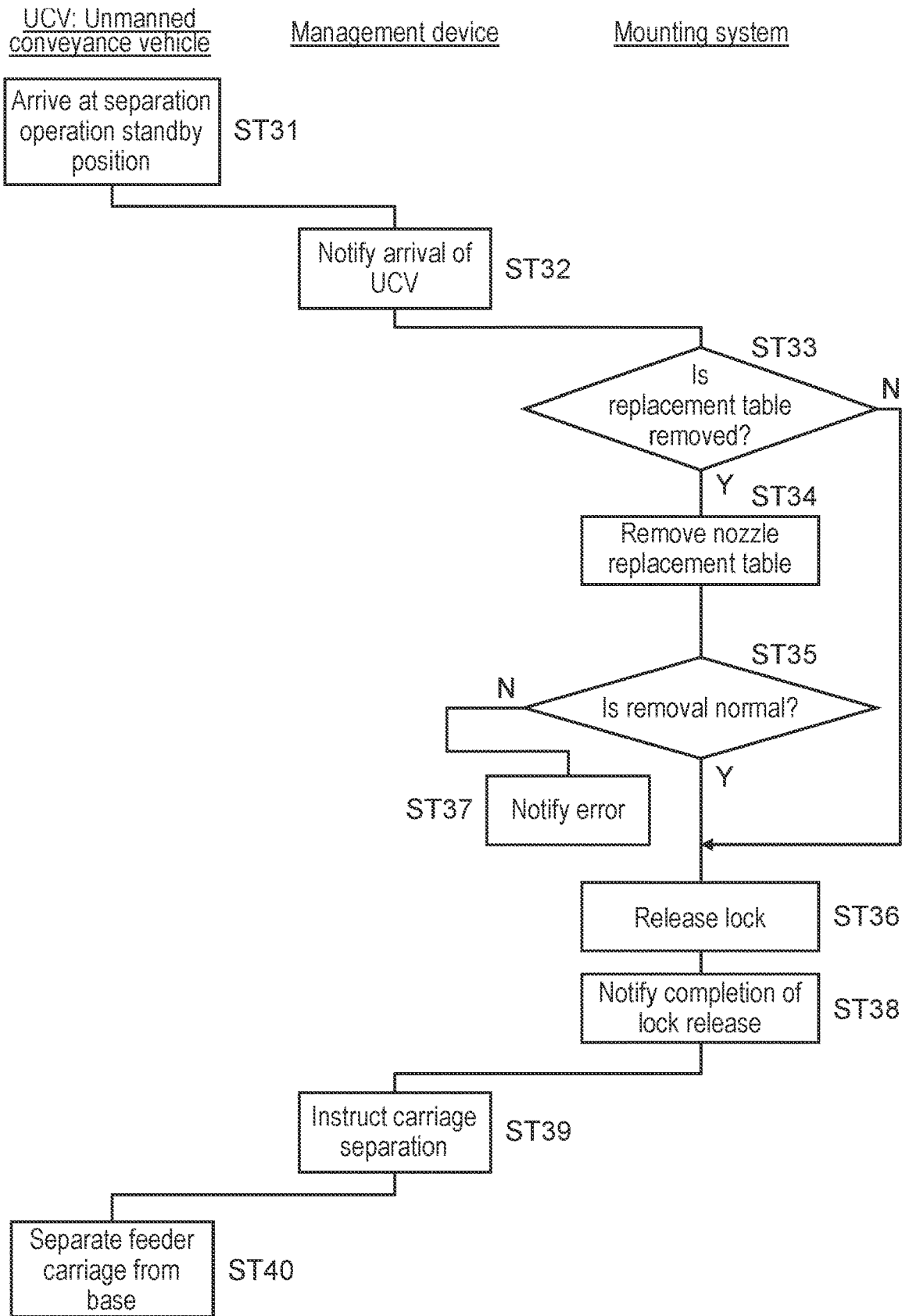
FIG. 27 is a flowchart illustrating an example of a flow of an operation of the work system including the component-mounting device according to the embodiment of the present disclosure.

FIG. 27 illustrates a flow of operations in a case where feeder carriage 14 connected to base 11 is separated from base 11 by unmanned conveyance vehicle 81. In the case where feeder carriage 14 connected to base 11 is separated from base 11 by unmanned conveyance vehicle 81, first, unmanned conveyance vehicle 81 is called to a position near component-mounting device 1 by management device 82, and further, predetermined feeder carriage 14 installed on component-mounting device 1 is moved to a position (separation operation standby position) where the separation operation of separating predetermined feeder carriage 14 can be started. In the present embodiment, the separation operation standby position is below feeder carriage 14. Then, when unmanned conveyance vehicle 81 arrives at the separation operation standby position (Step ST31 in FIG. 27), first notifier 821 causes controller 20 of component-mounting device 1 notify the mounting system of the arrival notification indicating that unmanned conveyance vehicle 81 arrives at a position near component-mounting device 1, that is, the separation operation standby position. (Step ST32). This arrival notification is sent via information management unit 205 to controller 20 of component-mounting device 1 on which feeder carriage 14 to be removed is installed.

When determiner 204 receives the arrival notification, determiner 204 determines whether or not to remove nozzle replacement table 31 by referring to the set-up changing information (Step ST33). Then, when determiner 204 determines to remove nozzle replacement table 31, second processor 203 causes replacement table holder 32 to remove nozzle replacement table 31 (Step ST34). Then, based on the output from placement state detection sensor 71, it is determined whether or not nozzle replacement table 31 is normally removed by replacement table holder 32 (Step ST35). In a case where determiner 204 determines that nozzle replacement table 31 is normally removed, second processor 203 starts the separation operation and causes carriage locker 11R to release the lock of feeder carriage 14 (Step ST36).

Meanwhile, in a case where second processor 203 determines in Step ST35 that nozzle replacement table 31 is not normally removed, second processor 203 does not cause carriage locker 11R to release of the lock of feeder carriage 14, and notifies operator OP through touch panel TP of the error (Step ST37). In a case where determiner 204 determines in Step ST23 that nozzle replacement table 31 is not removed, second processor 203 does not cause replacement table holder 32 to remove nozzle replacement table 31, starts the separation operation, and causes carriage locker 11R to release the lock of feeder carriage 14 (Step ST36).

When the lock of carriage locker 11R is released in Step ST36, second notifier 202 notifies (hereinafter, referred to as a lock release notification), through information management unit 205, the unmanned conveyance system of the completion of the lock release (Step ST38). Then, when first notifier 821 of management device 82 receives the lock release notification, first notifier 821 of management device 82 instructs unmanned conveyance vehicle 81 to separate feeder carriage 14 (carriage separation) (Step ST39). When unmanned conveyance vehicle 81 receives the instruction of the carriage separation, unmanned conveyance vehicle 81 captures feeder carriage 14 by raising feeder carriage 14 so that feeder carriage 14 floats from the floor surface and travels in the direction away from component-mounting device 1 in a state where feeder carriage 14 floats from the floor surface (Step ST40). Accordingly, the separation operation of separating feeder carriage 14 from base 11 is completed.

As described above, in work system 83 including the mounting system and the unmanned conveyance system, before management device 82 causes unmanned conveyance vehicle 81 to transfer feeder carriage 14 and separates feeder carriage 14 from base 11, controller 200 determines whether or not nozzle replacement table 31 held by replacement table holder 32 is removed from replacement table holder 32. In a case where nozzle replacement table 31 is to be removed, nozzle replacement table 31 is removed from replacement table holder 32 and is placed on placing table 36, and then carriage locker 11R releases the lock of feeder carriage 14. In a case where the nozzle replacement table 31 is not to be removed, nozzle replacement table 31 is not removed from replacement table holder 32, and carriage locker 11R releases the lock of feeder carriage 14.

Figure 28:
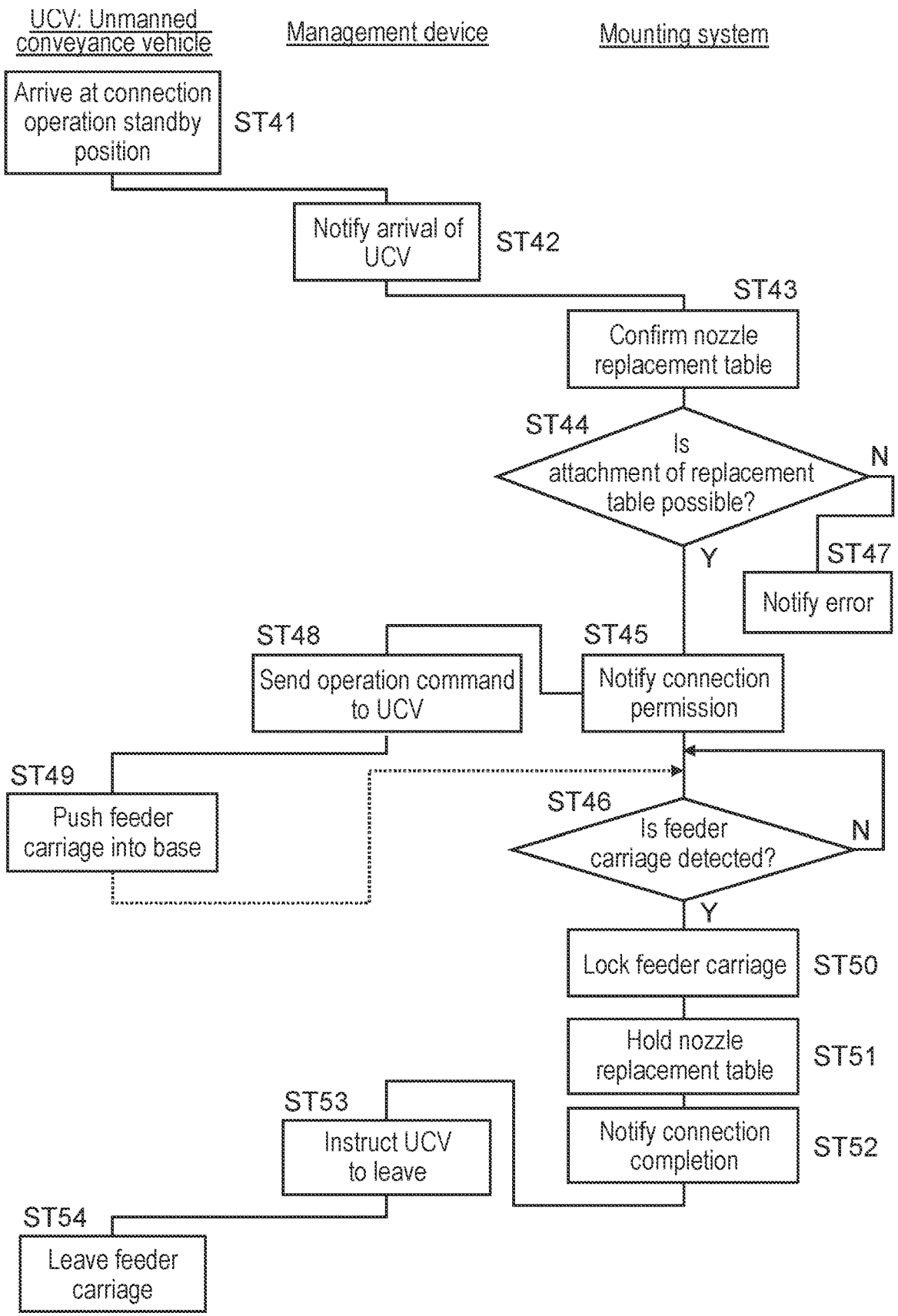
FIG. 28 is a flowchart illustrating an example of the flow of the operation of the work system including the component-mounting device according to the embodiment of the present disclosure.

FIG. 28 illustrates a flow of operations in a case where feeder carriage 14 is connected to base 11 by unmanned conveyance vehicle 81 and nozzle replacement table 31 is installed on base 11. In the case where feeder carriage 14 is connected to base 11 by unmanned conveyance vehicle 81, first, unmanned conveyance vehicle 81 transfers feeder carriage 14 scheduled to be connected to component-mounting device 1 to a connection operation standby position near component-mounting device 1. Then, when unmanned conveyance vehicle 81 arrives at the connection operation standby position (Step ST41 in FIG. 28), first notifier 821 detecting this arrival notifies the information management unit 205 of the mounting system of the arrival notification indicating that unmanned conveyance vehicle 81 transfers the feeder carriage 14 to the connection operation standby position at which the connection operation can start (Step ST42). At the connection operation standby position, unmanned conveyance vehicle 81 stands by in a state where placing table 36 of feeder carriage 14 facing component-mounting device 1 side.

Information management unit 205 relays the arrival notification from first notifier 821 to controller 200 of component-mounting device 1. When second processor 203 of controller 200 receives the arrival notification, second processor 203 of controller 200 confirms whether or not nozzle replacement table 31 remains in replacement table holder 32 on the side to which feeder carriage 14 is connected (Step ST43). Specifically, this confirmation is performed by determining whether or not nozzle replacement table 31 is held by replacement table holder 32 based on the output of above-described holding state detection sensor 72.

Second processor 203 determines whether or not nozzle replacement table 31 can be attached to replacement table holder 32 based on whether or not nozzle replacement table 31 is held by replacement table holder 32 (Step ST44). In a case where second processor 203 determines that nozzle replacement table 31 is not held by replacement table holder 32 and nozzle replacement table 31 can be attached, second processor 203 notifies unmanned conveyance system side of connection permission through information management unit 205 (Step ST45), and the state becomes a standby state where feeder carriage 14 transferred by unmanned conveyance vehicle 81 stands by to be detected by carriage detection sensor 11M (Step ST46). Meanwhile, in a case where it is determined in Step ST44 that nozzle replacement table 31 cannot be attached, operator OP is notified of an error through touch panel TP (Step ST47).

When first processor 822 of management device 82 receives the connection permission from the mounting system side, first processor 822 sends an operation command to unmanned conveyance vehicle 81 standing by at the connection operation standby position to start the connection operation (Step ST48). Unmanned conveyance vehicle 81, which receives the operation instruction from first processor 822, transfers feeder carriage 14 toward base 11 (Step ST49).

When feeder carriage 14 approaches base 11 and carriage-side connector 14C is fitted into base-side connector 11C, carriage detection sensor 11M reacts. Accordingly, second processor 203 detects that feeder carriage 14 reaches the connection operation standby position for base 11. (Step ST46). When second processor 203 detects that feeder carriage 14 reaches the connection operation standby position, feeder carriage 14 is locked to carriage locker 11R and connected to base 11 (Step ST50). Accordingly, the connection operation of feeder carriages 14 is completed. Thereafter, second processor 203 operates raising/lowering cylinder 54 of replacement table holder 32 to hold nozzle replacement table 31 by replacement table holder 32 (Step ST51). Accordingly, the installation of nozzle replacement table 31 on base 11 is completed. In a case where feeder carriage 14 in which replacement nozzle replacement table 31 is not set is connected, Step ST51 is skipped.

When nozzle replacement table 31 is held by replacement table holder 32, second notifier 202 notifies the unmanned conveyance system of connection completion indicating that the connection operation of feeder carriage 14 is completed (Step ST52). First processor 822 which receives the notification of the connection completion instructs unmanned conveyance vehicle 81 to leave (Step ST53). Unmanned conveyance vehicle 81, which receives the instruction to leave, releases the capture of feeder carriage 14 and leaves feeder carriage 14 (Step ST54).

As described above, in component-mounting device 1 according to the present embodiment, when feeder carriage 14 is connected to base 11 in the state where nozzle replacement table 31 is placed on placing table 36, replacement table holder 32 receives nozzle replacement table 31 from placing table 36 and is operated so as to hold nozzle replacement table 31 in the movable range of mounting head 17. Accordingly, operator OP can easily install nozzle replacement table 31 on base 11 without opening door 12C of base cover 12.

When nozzle replacement table 31 is held, replacement table holder 32 holds nozzle replacement table 31 in the state of being separated from placing table 36. Accordingly, after nozzle replacement table 31 is held by replacement table holder 32, feeder carriage 14 can be removed from base 11 as it is. After replacement table holder 32 returns held nozzle replacement table 31 to placing table 36, replacement table holder 32 separates feeder carriage 14 from base 11. Accordingly, nozzle replacement table 31 together with feeder carriage 14 is evacuated to an outside of base 11 and can be removed from base 11. Therefore, according to component-mounting device 1 of the present embodiment, operator OP can easily remove nozzle replacement table 31 from base 11 without opening door 12C of base cover 12.

When nozzle replacement table 31 described above is installed or removed, door 12C of base cover 12 is not opened. Accordingly, the safety device is not operated and operator OP can effectively perform the replacement operation of nozzle replacement table 31 without stopping the component mounting operation. Therefore, according to component-mounting device 1 of the present embodiment, operator OP can easily and effectively replace nozzle replacement table 31 without opening a portion (door 12C) of base cover 12.

When feeder carriage 14 is connected to base 11, component discard box 33 attached to feeder carriage 14 is located within the movable range of mounting head 17. Accordingly, operator OP can easily install component discard box 33 on base 11 without opening door 12C of base cover 12. By separating feeder carriage 14 from base 11, component discard box 33 can be pulled out together with feeder carriage 14 to the outside of base 11 and removed from base 11, and the discarded component input into component discard box 33 can be collected by mounting head 17. Therefore, according to the component-mounting device of the present embodiment, operator OP can easily perform the replacement operation (collection operation of the discarded component) of component discard box 33 without opening door 12C of base cover 12.

When component discard box 33 is installed or removed, door 12C of base cover 12 is not opened. Accordingly, the safety device is not operated and operator OP can effectively perform the replacement operation of component discard box 33 without stopping the component mounting operation. Therefore, according to component-mounting device 1 of the present embodiment, operator OP can easily and efficiently perform the replacement operation (the collection operation of the discarded component) of component discard box 33 without opening a portion (door 12C) of base cover 12.

As described above, the work system according to the present embodiment includes the mounting system which mounts component BH on board KB and the unmanned conveyance system having unmanned conveyance vehicle 81, and the mounting system and the unmanned conveyance system cooperate with each other to perform the operation of separating feeder carriage 14 from base 11 and the operation of connecting feeder carriage 14 to base 11.

In the work system according to the present embodiment, in the case where feeder carriage 14 is separated from base 11, the procedure of the operation of each portion is briefly described as follows. First, unmanned conveyance vehicle 81 moves to the position where the separation operation of separating feeder carriage 14 connected to base 11 from base 11 can start. (Step ST31). Then, the unmanned conveyance system which controls unmanned conveyance vehicle 81 notifies the mounting system of the arrival notification indicating that unmanned conveyance vehicle 81 arrives at the position where the separation operation can start (Step ST32). When the mounting system receives the arrival notification, the connection mechanism releases the connection of feeder carriage 14 (Step ST36), and the mounting system notifies the unmanned conveyance system of the release notification indicating that the connection of feeder carriage 14 is released. (Step ST38). Finally, when the unmanned conveyance system receives the release notification, unmanned conveyance vehicle 81 moves feeder carriage 14 in the direction away from base 11 (Step ST40).

In the work system according to the present embodiment, the procedure of the operation of each portion when feeder carriage 14 is connected to base 11 is briefly described as follows. First, unmanned conveyance vehicle 81 moves feeder carriage 14 scheduled to be connected to base 11 by unmanned conveyance vehicle 81 to the position where feeder carriage 14 can be connected by the connection mechanism (Step ST41), and in the mounting system, carriage detection sensor 11M detects whether or not feeder carriage 14 is located at the position where feeder carriage 14 can be connected by the connection mechanism. (Step ST46). Then, in the mounting system, when feeder carriage 14 is detected, the connection mechanism is operated to connect feeder carriage 14 to base 11 (Step ST50), and when the connection is completed, unmanned conveyance vehicle 81 travels in the direction away from feeder carriage 14 connected to base 11 (Step ST54). Here, when the unmanned conveyance system receives, from the mounting system, the connection permission (Step ST45) of permitting the connection of feeder carriage 14 to base 11, the unmanned conveyance system moves feeder carriage 14 scheduled to be connected to the position where feeder carriage 14 can be connected by the connection mechanism (Step ST49).

As described above, in the work system (and the transfer method of feeder carriage 14) according to the present embodiment, the mounting system and the unmanned conveyance system cooperate with each other to perform the operation of separating feeder carriage 14 from base 11 and the operation of connecting feeder carriage 14 to the base 11. At this time, after each operation is performed, the mounting system and the unmanned conveyance system notify the other party of the completion of the operation and proceed the operations while confirming each other's operations. Therefore, according to the work system and the transfer method (the procedure for transferring feeder carriage 14 illustrated in the flowcharts of FIGS. 27 and 28) of feeder carriage 14 in the present embodiment, the mounting system and the unmanned conveyance system are linked to each other so that feeder carriage 14 can be replaced, and the operations can be smoothly and reliably advanced.

Hereinbefore, the embodiment of the present disclosure is described above. However, the present disclosure is not limited to the above, and various modifications or the like is possible. For example, in the above-described embodiment, feeder carriage 14 is connected to the plurality of locations (front side and rear side) of base 11. However, this is an example, and a configuration in which feeder carriage 14 is attached to one location of base 11 may be adopted. Feeder carriage 14 may be connected to plurality of location of each of the front side and the rear side. The configuration of nozzle replacement table 31, replacement table holder 32, component discard box 33, box holding member 34, or the like is merely an example, and nozzle replacement table 31, replacement table holder 32, component discard box 33, box holding member 34, or the like may have a configuration other than the configuration illustrated in the above-described embodiment. Carriage detection sensor 11M is configured to detect that feeder carriage 14 is located at the position where feeder carriage 14 can be connected to base 11. However, carriage detection sensor 11M may be an optical sensor, a magnetic sensor, or an electric detection sensor.

In the example of work system 83, management device 82 is configured to have first notifier 821 and first processor 822. However, all or a portion of these may be realized by unmanned conveyance vehicle 81. Similarly, controller 200 is configured to include second notifier 202, second processor 203, and determiner 204. However, all or a portion of these may be realized by information management unit 205.

The work system and the feeder carriage transfer method capable of replacing the feeder carriage by linking the mounting system and the unmanned conveyance system are provided.

What is claimed is:

1. A work system configured to transfer a feeder carriage by an unmanned conveyance vehicle, the work system comprising:
   a mounting system including a connection mechanism configured to lock the feeder carriage comprising a plurality of part feeders;
   a mounting-system processor configured to perform a release operation that causes the connection mechanism to release a lock of the feeder carriage; and
   an unmanned conveyance system configured to be in communication with the mounting system,
   the unmanned conveyance system comprising a first notifier configured to notify the mounting-system of an arrival notification indicating that the unmanned conveyance vehicle arrives at a position where the feeder carriage can be separated from the mounting system,
   the unmanned conveyance system comprising a conveyance-system processor configured to perform conveyance-system operations causing the unmanned conveyance vehicle comprising a capturing mechanism to capture the feeder carriage and the unmanned conveyance vehicle to travel in a direction away from the mounting system,
   wherein the mounting-system processor is configured to perform the release operation based on the arrival notification sent to the mounting-system processor from the first notifier of the unmanned conveyance system.

2. The work system of claim 1, wherein the conveyance-system operations are further configured to cause the unmanned conveyance vehicle to move to the feeder carriage locked by the connection mechanism.

3. The work system of claim 1, wherein the feeder carriage includes a nozzle replacement table.

4. The work system of claim 1, wherein the mounting system comprises a replacement table holder configured to hold a nozzle replacement table comprising a plurality of nozzles,
   the mounting-system processor is configured to perform a delivery operation of delivering the nozzle replacement table from the replacement holder to the feeder carriage, and
   the mounting-system processor is configured to perform the delivery operation based on the arrival notification sent to the mounting-system processor from the first notifier of the unmanned conveyance system.

5. The work system of claim 4, wherein the mounting-system is configured to store a set-up changing information and determine whether the nozzle replacement table is required to be removed from the replacement table holder based on the set-up changing information, and
   the mounting system is configured to determine whether to remove the nozzle replacement table from the replacement table holder based on the arrival notification sent to the mounting-system processor from the first notifier of the unmanned conveyance system.

* * * * *